United States Patent
Shimada et al.

(10) Patent No.: US 8,663,880 B2
(45) Date of Patent: Mar. 4, 2014

(54) POLYMERIZABLE COMPOSITION FOR COLOR FILTER, COLOR FILTER, AND SOLID-STATE IMAGING DEVICE

(75) Inventors: Kazuto Shimada, Haibara-gun (JP); Masaomi Makino, Haibara-gun (JP); Tatsuya Tanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 230 days.

(21) Appl. No.: 13/129,326

(22) PCT Filed: Apr. 15, 2010

(86) PCT No.: PCT/JP2010/056764
§ 371 (c)(1),
(2), (4) Date: May 13, 2011

(87) PCT Pub. No.: WO2010/119924
PCT Pub. Date: Oct. 21, 2010

(65) Prior Publication Data
US 2011/0217637 A1    Sep. 8, 2011

(30) Foreign Application Priority Data
Apr. 16, 2009  (JP) .................................. 2009-100214

(51) Int. Cl.
*G02B 5/20*    (2006.01)
(52) U.S. Cl.
USPC .............................. 430/7; 430/270.1; 257/440
(58) Field of Classification Search
None
See application file for complete search history.

(56) References Cited

U.S. PATENT DOCUMENTS

2005/0258406 A1*  11/2005  Onishi et al. .................. 252/582
2006/0041053 A1    2/2006  Kamata et al.

FOREIGN PATENT DOCUMENTS

| EP | 2112182 A1 | 10/2009 |
|----|------------|---------|
| EP | 2169463 A2 | 3/2010 |
| JP | 03-056964 A | 3/1991 |
| JP | 10-324819 A | 12/1998 |
| JP | 2001-222109 A | 8/2001 |
| JP | 2002-214593 A | 7/2002 |
| JP | 2004-198717 A | 7/2004 |
| JP | 2005-062494 A | 3/2005 |
| JP | 2005-173325 A | 6/2005 |
| JP | 2005-338400 A | 12/2005 |
| JP | 2007-033467 A * | 2/2007 |
| JP | 2007-034119 A | 2/2007 |

OTHER PUBLICATIONS

Computer-generated transaltion of JP 2007-033467 (Feb. 2007).*
Communication, dated Nov. 5, 2012, issued in corresponding EP Application No. 10764506.1, 14 pages.
Office Action dated Nov. 19, 2013 in Japanese Application No. 2010-094239.

* cited by examiner

*Primary Examiner* — John A. McPherson
(74) *Attorney, Agent, or Firm* — Sughrue Mion, PLLC

(57) ABSTRACT

A polymerizable composition for a color filter, including (A) a polymerizable compound, (B) a polymerization initiator, (C) a coloring agent, and (D) a polymer including at least a group having polymerization inhibiting ability and a group having surface localizability.

14 Claims, No Drawings

POLYMERIZABLE COMPOSITION FOR COLOR FILTER, COLOR FILTER, AND SOLID-STATE IMAGING DEVICE

CROSS REFERENCE TO RELATED APPLICATIONS

This application is a National Stage of International Application No. PCT/JP2010/056764 filed Apr. 15, 2010, which claims priority from Japanese Patent Application No. 2009-100214 filed Apr. 16, 2009, the contents of all of which are incorporated herein by reference in their entirety.

TECHNICAL FIELD

The present invention relates to a polymerizable composition for a color filter, and further relates to a color filter using the same and a solid-state imaging device.

BACKGROUND ART

In recent years, in color filters for color separation used in image sensors, which are solid-state imaging devices, reduction in thickness and micronization for high resolution are in progress. Together with the progress of reduction in thickness of color filter layers which are formed using coloring agents of, for example, red, green, blue, cyan, magenta, or yellow, and micronization of pixels, reduction in thickness of silicon wafers and wiring substrates on which these color filter layers are formed is also in progress.

Accompanying the reduction in thickness of a silicon wafer, there has been a problem in that noise is caused in an image due to light from the backside. In order to suppress the light from the backside, application of light-shielding properties at the backside of the color filter, on a solder resist, and/or on a substrate by using a light-shielding black resist or the like has been studied.

Particularly, taking resolution and the like into consideration, light-shielding properties are required with respect to the wavelengths from the ultraviolet region to the infrared region. In order to realize such light-shielding properties, coloring agents of red, green, blue, cyan, magenta, yellow, or the like are used in combination, or a black dye or pigment is used to realize the light-shielding properties.

For the formation of colored layers of a color filter, a colored polymerizable composition is used (photo-lithographic method). However, since the coloring agents have light-shielding properties in any cases of using coloring agents in combination, exposure light in the exposure process cannot reach the depth (a lower layer portion) of the colored layers for forming a color filter, and as a result, curing in the vicinity of the surface of a substrate such as a silicon wafer may be insufficient. Particularly, in the case of using a black pigment such as carbon black for the purpose of maintaining light-shielding properties with respect to a region including the infrared region, transmittance of the exposure light for photo-curing in the exposure process (mainly, ultraviolet rays or a visible light) is low, and only the surface of the colored layer is cured. Therefore, there is a problem in that developability at the outermost surface of the colored layer and developability in the vicinity of the substrate in the colored layer become different, and a pattern shape of the obtained colored layer may be deteriorated.

Further, in the case of forming an image by light exposure through a mask in the exposure process, there is a problem in that the image may become wide with respect to the mask size, due to diffraction at the mask or amplification of polymerization.

Furthermore, there is another problem in that, when exposure is carried out using an exposure apparatus with high illuminance, sensitivity is increased due to reciprocity law failure, and amplification of polymerization becomes great, and as a result, the image may become too wide with respect to the mask size. Particularly, in a polymerization system in which absorbance is high at the exposure wavelength, this problem is remarkable. In a case in which exposure is carried out using g-line, h-line, i-line, or the like, when a polymerizable composition colored to be black, blue, green, or red is used, this problem is remarkable. In particular, when a polymerizable composition colored to be black or blue is used, sensitivity at the surface of the colored layer is extremely high, and there are cases in which the sensitivity is required to be greatly adjusted according to the exposure method.

The above problem is particularly remarkable when a photosensitive material having high absorbance at the exposure wavelength is used and sufficient exposure is carried out in order to ensure sufficient adhesion.

Colored layers of a color filter are usually formed through coating a colored polymerizable composition on a support such as a glass substrate or the like. A method of adding a fluoro surfactant to a polymerizable composition in order to improve the coated surface state is known (for example, see Japanese Patent Application Laid-Open (JP-A) No. 2005-173325). However, although conventionally known fluoro surfactants or the like have an effect of flattening the colored layer surface and improving the coated surface state of the colored layer, the conventionally known fluoro surfactants or the like cannot control the sensitivity of the colored layer.

Further, a method of adding a polymerization inhibitor in order to suppress a dark reaction during storage of a polymerizable composition and to improve storability of the polymerizable composition is known (see, for example, JP-A No. 2007-34119). However, although this technology can improve storability of a polymerizable composition or suppress the curability of the whole of a polymerizable composition layer, this technology cannot be used to suppress only the curability of a surface portion of a polymerizable composition layer and to improve pattern formability.

SUMMARY OF INVENTION

An object of the present invention is to obtain a polymerizable composition for a color filter, which enables suppression of illuminance dependency even if an exposure apparatus with a different illuminance is used when a colored pattern is formed, which is excellent in curability in a formed colored pattern even if the film is thin or the pattern is fine, and which can provide a rectangular pattern with excellent resolution. A further object of the present invention is to obtain a color filter having a good color separation property, and a solid-state imaging device with a high resolution, by using the polymerizable composition.

The above objects are achieved by the following means.

<1> A polymerizable composition for a color filter, comprising (A) a polymerizable compound, (B) a polymerization initiator, (C) a coloring agent, and (D) a polymer comprising at least a group having polymerization inhibiting ability and a group having surface localizability.

<2> The polymerizable composition for a color filter according to <1>, wherein the group having polymerization inhibiting ability is a functional group selected from the group consisting of an amino group, a phenol group, and an N-oxide group.

<3> The polymerizable composition for a color filter according to <1> or <2>, wherein the group having surface localizability is a functional group selected from the group consisting of an alkyl group having from 6 to 30 carbon atoms, a fluoroalkyl group having from 3 to 25 carbon atoms, and a siloxane group.

<4> The polymerizable composition for a color filter according to any one of <1> to <3>, wherein (C) the coloring agent is titanium black.

<5> The polymerizable composition for a color filter according to any one of <1> to <4>, wherein the solid content of the polymerizable composition for a color filter is in a range of from 25% by mass to 40% by mass.

<6> A color filter comprising, on a support, a colored pattern that is formed from the polymerizable composition for a color filter according to any one of <1> to <5>.

<7> A solid-state imaging device equipped with the color filter according to <6>.

The polymerizable composition for a color filter of the present invention (hereinafter, also simply referred to as a "polymerizable composition") includes (D) a polymer having at least a group having polymerization inhibiting ability and a group having surface localizability. Thereby, in the colored layer formed by coating and drying the polymerizable composition of the present invention, (D) the polymer having at least a group having polymerization inhibiting ability and a group having surface localizability localizes at the surface of the colored layer by the action of the group having surface localizability. Further, at the time of exposure, polymerization at the surface portion of the colored layer is suppressed by the action of the group having polymerization inhibiting ability. Particularly, polymerization at a non-desired portion of the colored layer surface which is caused by diffraction of a mask or amplification of polymerization is suppressed. In the development process, a difference in development proceeding rate between the non-desired portion of the colored layer surface where polymerization is suppressed and the unexposed portion becomes smaller, as compared with a polymerizable composition that does not employ the present invention, and development appropriately proceeds in both of the non-desired portion and the unexposed portion. It is thought that a rectangular pattern can be obtained in this way.

It is thought that, by this action, the illuminance dependency can be suppressed to be small, even in a case in which an exposure apparatus with a different illuminance is used.

Therefore, according to the invention, a polymerizable composition for a color filter may be obtained, which enables suppression of illuminance dependency even if an exposure apparatus with a different illuminance is used when a colored pattern is formed, which is excellent in curability in a formed colored pattern even if the film is thin or the pattern is fine, and which can provide a rectangular pattern with excellent resolution. Further, a color filter having a good color separation property, and a solid-state imaging device with a high resolution may be obtained by using the polymerizable composition.

DESCRIPTION OF EMBODIMENTS

The present invention relates to a polymerizable composition used for producing a color filter. The polymerizable composition of the present invention includes (A) a polymerizable compound, (B) a polymerization initiator, (C) a coloring agent, and (D) a polymer having at least a group having polymerization inhibiting ability and a group having surface localizability (hereinafter, referred to as a "specific polymer").

The polymerizable composition of the present invention is explained below in detail.

<(D) Polymer Having at Least Group Having Polymerization Inhibiting Ability and Group Having Surface Localizability (Specific Polymer)>

The polymerizable composition of the present invention includes (D) a polymer having at least a group having polymerization inhibiting ability and a group having surface localizability (specific polymer).

The specific polymer which can be used in the present invention is a polymer having at least one group having polymerization inhibiting ability and at least one group having surface localizability.

The group having polymerization inhibiting ability means a functional group which can inhibit radical polymerization. Examples of the group having polymerization inhibiting ability include a phenol group, a primary amino group, a secondary amino group, a tertiary amino group, an N-oxide group, a nitro group, a nitroso group, a malonitrile group, a thiol group, a sulfide group, a disulfide group, a quinone group, and a polyolefin group. Among them, a phenol group, a secondary amino group, a tertiary amino group, and an N-oxide group are preferable, from the viewpoints of the polymerization inhibiting ability and production suitability.

The specific polymer may include one or more groups having polymerization inhibiting ability, or the specific polymer may contain two or more groups having polymerization inhibiting ability.

The content of the group(s) having polymerization inhibiting ability in the specific polymer may be from 0.5% by mass to 50% by mass, and the content is preferably from 1% by mass to 30% by mass. When the content is within this range, a formed colored pattern is excellent in curability, and a rectangular pattern with excellent resolution may be obtained.

Further, the group having surface localizability means a group having a tendency of being separated to be present at the surface of a polymerizable composition layer, because the group does not have compatibility with the main component of the polymerizable composition, and the group and the main component reject each other. Examples of the group having surface localizability include an alkyl group having from 6 to 30 carbon atoms (preferably, an alkyl group having from 6 to 20 carbon atoms), an alkenyl group having from 6 to 30 carbon atoms (preferably, an alkenyl group having from 6 to 20 carbon atoms), an alkynyl group having from 6 to 30 carbon atoms (preferably, an alkynyl group having from 6 to 20 carbon atoms), an aryl group having from 6 to 25 carbon atoms (preferably, an aryl group having from 6 to 18 carbon atoms), a fluorinated alkyl group having from 3 to 25 carbon atoms (preferably, a fluorinated alkyl group which has from 4 to 16 carbon atoms and has a substitutional rate of hydrogen atoms to fluorine atoms of from 25% to 100%), a fluorinated alkenyl group having from 3 to 20 carbon atoms (preferably, a fluorinated alkenyl group which has from 4 to 16 carbon atoms and has a substitutional rate of hydrogen atoms to fluorine atoms of from 25% to 100%), a fluorinated alkynyl group having from 3 to 20 carbon atoms (preferably, a fluorinated alkynyl group which has from 4 to 16 carbon atoms and has a substitutional rate of hydrogen atoms to fluorine atoms of from 25% to 100%), and a fluorinated aryl group having from 6 to 25 carbon atoms (preferably, a fluorinated aryl group which has from 6 to 14 carbon atoms and has a substitutional rate of hydrogen atoms to fluorine atoms of from 25% to 100%).

Note that, these groups may be substituted by a branched chain.

Further, a polysiloxane structure is also a group having surface localizability. The polysiloxane structure means a structure in which siloxane groups (-silicon-oxygen-) are linked together, and in the present invention, the number of silicon atoms contained in the polysiloxane structure is preferably in a range of from 11 to 200.

Among them, from the viewpoint of accelerating the localization of the specific polymer toward the colored layer surface, preferable examples of the group having surface localizability include a fluorinated alkyl group, an alkyl group, a fluorinated alkenyl group, an alkenyl group, and a group having a polysiloxane structure. Among these groups, a fluorinated alkyl group, an alkyl group, and a group having a polysiloxane structure are more preferable.

Further, the specific polymer may include one or more groups having surface localizability, or the specific polymer may contain two or more groups having surface localizability.

The content of the group(s) having surface localizability in the specific polymer may be in a range of from 1% by mass to 80% by mass, and the content is preferably in a range of from 5% by mass to 50% by mass. When the content is within this range, a formed colored pattern is excellent in curability, and a rectangular pattern with excellent resolution may be obtained.

Further, the proportion of the group(s) having polymerization inhibiting ability to the group(s) having surface localizability in the specific polymer (group(s) having polymerization inhibiting ability:group(s) having surface localizability) is preferably within a range of from 5:95 to 95:5, and more preferably within a range of from 20:80 to 80:20, on the basis of mass.

As a method of introducing the group having polymerization inhibiting ability and the group having surface localizability into the specific polymer, (1) a method of copolymerizing a polymerizable monomer having a group having polymerization inhibiting ability and a polymerizable monomer having a group having surface localizability, (2) a method of allowing a polymer having an active group such as an isocyanato group or a hydroxy group in a side chain thereof to react with a compound which has a group having polymerization inhibiting ability or a group having surface localizability and has a functional group that reacts with the active group of the polymer, (3) a method of introducing a group having polymerization inhibiting ability and a group having surface localizability into a polymer having any one of a sulfonic acid group, a carboxylic acid group, a phosphoric acid group, or an amino group, by means of ion exchange, or the like can be adopted.

Further, in the case where the specific polymer has a polysiloxane structure, the specific polymer can be obtained according to a synthesis method of using a siloxane oligomer that is obtained through hydrolysis of amino-alkyl-methyldimethoxysilane, and a cyclic siloxane or the like.

In the synthesis method belonging to the above (1), preferable examples of the polymerizable monomer having a group having polymerization inhibiting ability include N,N-dimethylamino ethyl methacrylate, N,N-diethylamino ethyl methacrylate, hydroxyphenylmethacrylamide, vinylpyridine, N,N-dimethylamino ethyl acrylate, N,N-diethylamino ethyl acrylate, N,N-dimethylamino ethyl acrylamide, and N,N-diethylamino ethyl methacrylamide.

In the synthesis method belonging to the above (1), preferable examples of the polymerizable monomer having a group having surface localizability include nonafluorobutyl ethyl methacrylate, nonafluorobutyl methacrylate, bis(trifluoromethyl)methyl methacrylate, perfluorooctyl acrylate, stearyl methacrylate, pentadecyl acrylate, 3,3,4,4,5,5,6,6,6-nonafluorohexyl methacrylate, 3,3,4,4,5,5,6,6,6-nonafluorohexyl acrylate, perfluorophenyl methacrylate, 1H,1H,1H-perfluorodecyl methacrylate, 1H,1H,1H-perfluorodecyl acrylate, PFPE (perfluoroalkylpolyether)acrylate, 1H,1H,2H-perfluoro-1-tetradecene, and 1H,1H,9H-perfluorononyl acrylate.

In the synthesis method belonging to the above (2), examples of the polymer having an active group such as an isocyanato group or a hydroxy group in a side chain thereof include a copolymer obtained through copolymerization using an isocyanato group-containing monomer such as 2-isocyanatoethyl methacrylate, 2-isocyanatoethyl acrylate, or KARENZ MOI-EG (trade name, manufactured by Showa Denko K.K.); and a copolymer obtained through copolymerization using a monomer such as hydroxyalkyl(meth)acrylate, in which the alkyl group has from 2 to 12 carbon atoms, such as hydroxyethyl(meth)acrylate, hydroxy n-propyl (meth)acrylate, or hydroxy n-butyl(meth)acrylate, or hydroxyaryl(meth)acrylate in which the aryl group has from 6 to 12 carbon atoms.

In the synthesis method belonging to the above (2), examples of the compound which has a group having polymerization inhibiting ability and a functional group that reacts with an active group such as an isocyanato group or a hydroxy group include 3-dimethylamino propanol, N,N-diethylamino ethylenediamine, 4-hydroxy-TEMPO free radical, 4-amino-TEMPO free radical, 3-(isothiocyanatomethyl)-PROXYL free radical, nicotinic acid N-oxide, nitroaniline, nitrophenol, nitrosophenol, iodonitrobenzene, thiomorpholine, and aminophenol.

In the synthesis method belonging to the above (2), examples of the compound which has a group having surface localizability and a functional group that reacts with an active group such as an isocyanato group or a hydroxy group include decanethiol, tetradecyl glycidyl ether, 2,2,3,3,4,4,5,5-octafluoro-1-pentanol, 3,3,4,4,5,5,6,6,7,7,8,8,8-tridecafluoro-1-octanol, perfluorodecanoic acid, 1H,1H-perfluoro-3,6,9-trioxatridecan-1-ol, and 3-(perfluorooctyl)-1,2-epoxypropane.

Further, as a method of introducing a group having polymerization inhibiting ability and a group having surface localizability by means of ion exchange in the synthesis method belonging to the above (3), a method of mixing, in a solution, a compound having an amino group or an ammonium group and including a group having polymerization inhibiting ability such as a nitro group or a phenol group, with a polymer having a sulfonic acid group and/or a salt thereof, a carboxylic acid group and/or a salt thereof, a phosphonic acid group and/or a salt thereof, or the like may be described.

Alternatively, a method of mixing sulfonic acid and/or a salt thereof, carboxylic acid and/or a salt thereof, phosphonic acid and/or a salt thereof, or the like, each including a group having polymerization inhibiting ability such as a nitro group or a phenol group, with a polymer having an amino group or an ammonium group may be described.

Further, a method of mixing, in a solution, a compound having an amino group or an ammonium group and including a group having surface localizability such as a perfluoroalkyl group or an alkyl group, with a polymer having a sulfonic acid group and/or a salt thereof, a carboxylic acid group and/or a salt thereof, a phosphonic acid group and/or a salt thereof, or the like may be described.

Furthermore, a method of mixing sulfonic acid and/or a salt thereof, carboxylic acid and/or a salt thereof, phosphonic acid and/or a salt thereof, or the like, each including a group having surface localizability such as a perfluoroalkyl group or an alkyl group, with a polymer having an amino group or an ammonium group may be described.

The specific polymer may further include a structural unit derived from a polymerizable monomer having a group other than the group having polymerization inhibiting ability and the group having surface localizability.

In one of preferable embodiments, such a polymerizable monomer is a monomer including a hydrophilic group such as a styryl group, a hydroxy group, a carboxylic acid group or a salt thereof, a phosphonic acid group or a salt thereof, a phosphoric acid group or a salt thereof, a sulfonic acid group or a salt thereof, a sulfuric acid group or a salt thereof, a primary amino group, a secondary amino group, a tertiary amino group, a quaternary ammonium group, a pyridinium group, or a polyoxyalkylene group.

Among them, a primary amino group, a secondary amino group, and a tertiary amino group overlap with the groups having polymerization inhibiting ability, and are hydrophilic groups having polymerization inhibiting ability.

It should be noted that, in the present specification, "(meth)acrylic acid" is a general term for acrylic acid and methacrylic acid, and "(meth)acrylate" is a general term for acrylate and methacrylate.

Specifically, hydroxyalkyl(meth)acrylates in which the alkyl group has from 2 to 12 carbon atoms such as hydroxyethyl(meth)acrylate, hydroxy n-propyl(meth)acrylate, and hydroxy n-butyl(meth)acrylate, hydroxyaryl(meth)acrylates in which the aryl group has from 6 to 12 carbon atoms, styrene, 4-acetoxystyrene, and monomers including an acid group such as (meth)acrylic acid, itaconic acid, crotonic acid, maleic acid, or partially esterified maleic acid are preferable.

Furthermore, examples of the polymerizable monomer having a group other than the group having polymerization inhibiting ability and the group having surface localizability may further include (meth)acrylates including an alkyl group having 5 or less carbon atoms and vinyl esters including an alkyl group having 5 or less carbon atoms.

Specific examples of the structure of the specific polymer are shown below, while the scope of the invention is not limited thereto.

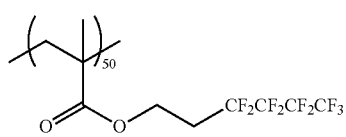

(K-1)

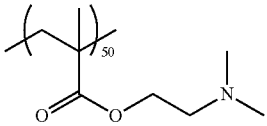

Mw = 5000

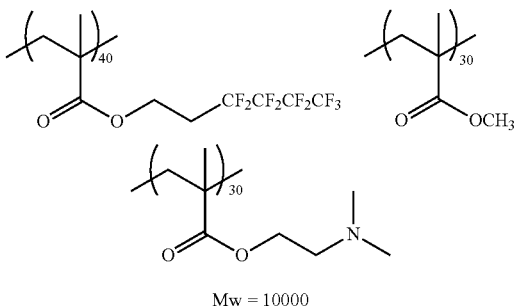

(K-2)

Mw = 10000

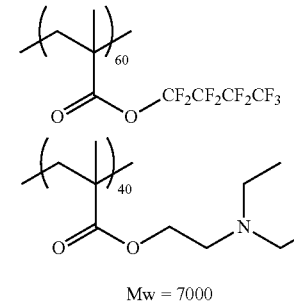

(K-3)

Mw = 7000

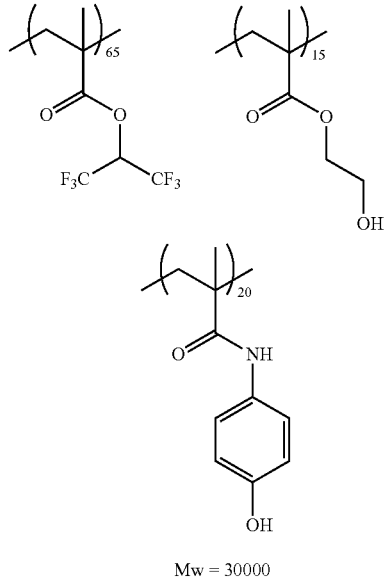

(K-4)

Mw = 30000

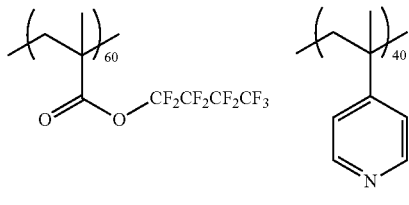

(K-5)

Mw = 1200

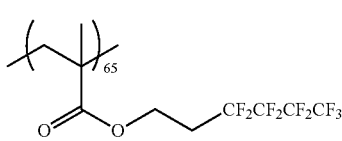

(K-6)

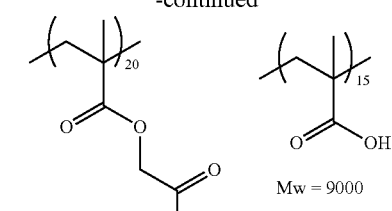
Mw = 9000
(K-7)
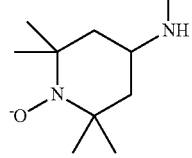
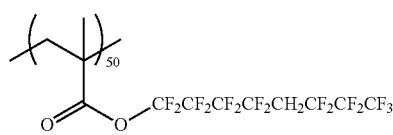
Mw = 35000
(K-8)
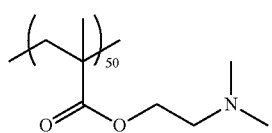
Mw = 10000
(K-9)
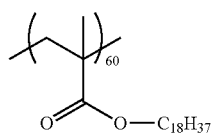
Mw = 15000
(K-10)
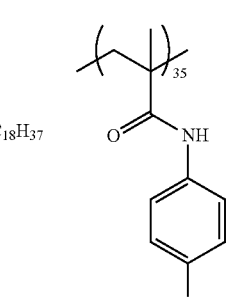
Mw = 7500
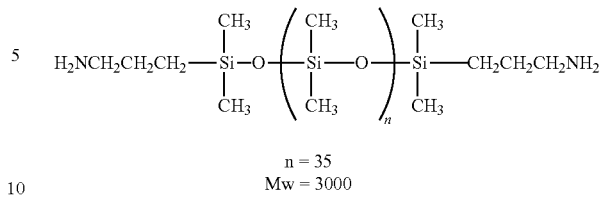
n = 35
Mw = 3000
(K-11)
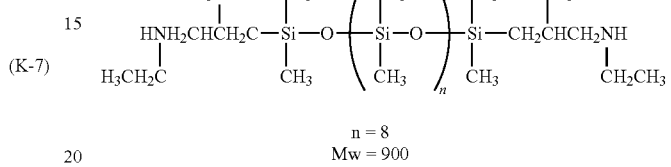
n = 8
Mw = 900
(K-12)
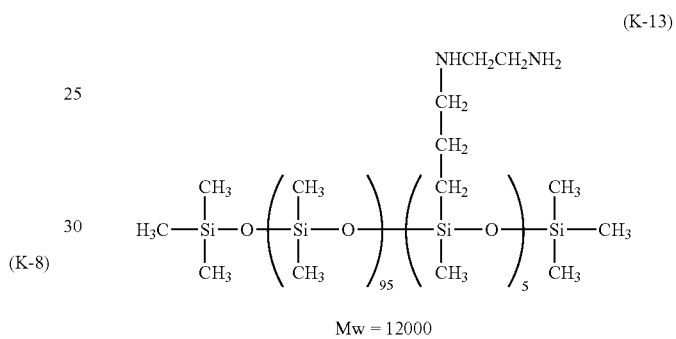
Mw = 12000
(K-13)
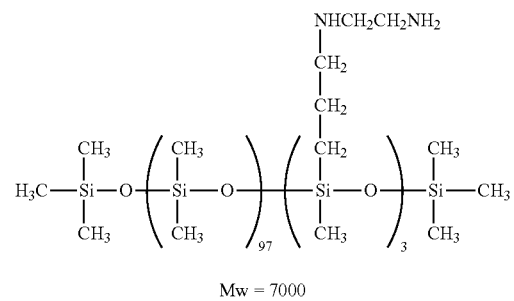
Mw = 7000
(K-14)
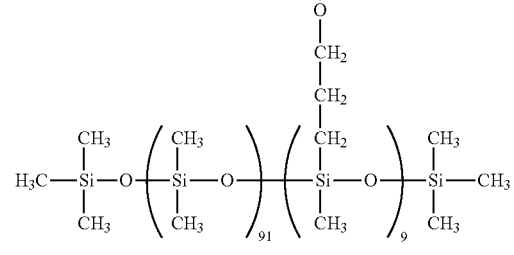
Mw = 10000
(K-15)

-continued

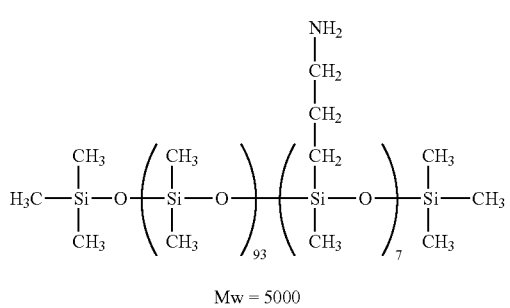
(K-16)

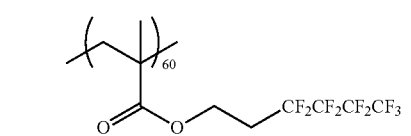
(K-17)

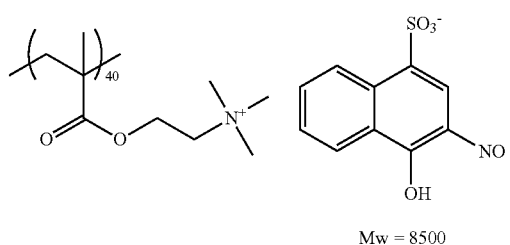
(K-18)

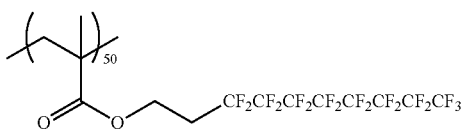

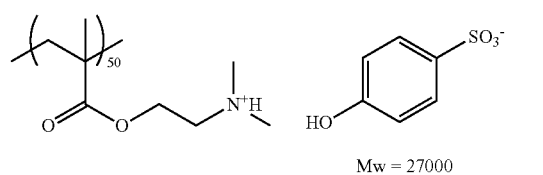
(K-19)

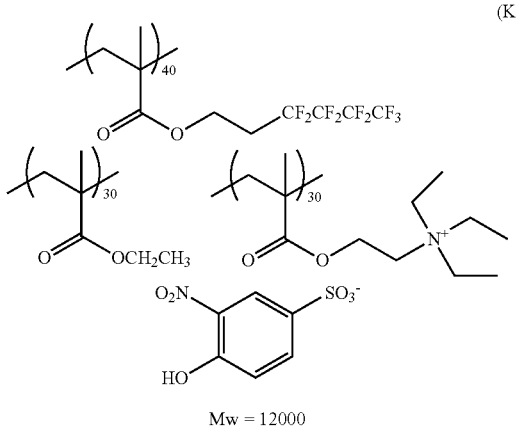

-continued

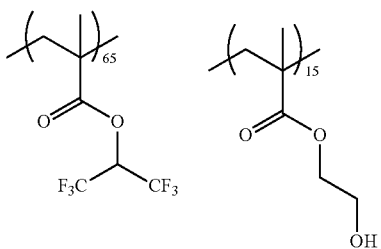
(K-20)

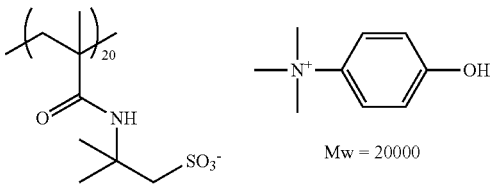

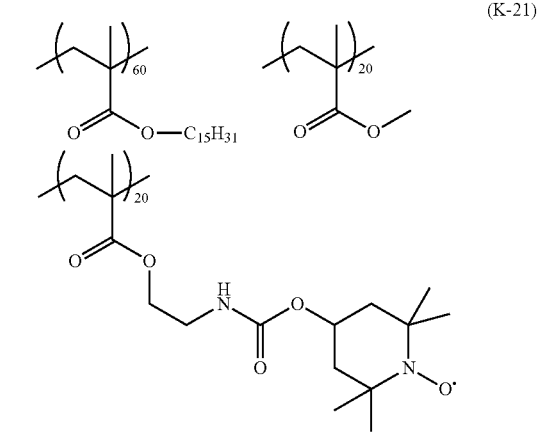
(K-21)

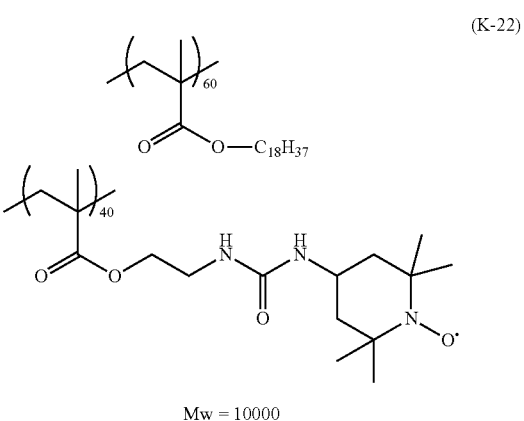
(K-22)

The weight average molecular weight of the specific polymer is preferably from 3,000 to 100,000 and more preferably from 5,000 to 30,000. In the case where the weight average molecular weight is within this range, the specific polymer may localize at the surface when the polymerizable composition is coated and dried to form a layer, and moreover, may demonstrate the polymerization inhibiting function, so that the pattern obtained by exposure and development can exhibit a good rectangular shape.

The amount of the specific polymer contained in the polymerizable composition is not particularly limited, but is preferably in a range of from 0.001% by mass to 10% by mass, and more preferably from 0.005% by mass to 5% by mass in the solid content of the polymerizable composition. When the content is within this range, the effect of the specific polymer in the present invention may be demonstrated and a good pattern can be obtained.

<(C) Coloring Agent>

Examples of (C) the coloring agent which can be used in the present invention include various conventionally known inorganic pigments and organic pigments. Whether the coloring agent is an inorganic pigment or an organic pigment, the coloring agent preferably has a high transmittance. In consideration of high transmittance, it is preferable to use a pigment with a particle size as small as possible. Also in consideration of handling property, a mean particle diameter of the pigment is preferably from 0.005 µm to 0.1 µm, and more preferably from 0.005 µm to 0.05 µm.

Examples of the inorganic pigment include metal compounds such as metal oxides and metal complex salts. Specific examples thereof may include metal oxides of iron, cobalt, aluminum, cadmium, lead, copper, titanium, magnesium, chromium, zinc, or antimony and metal composite oxides of the above metal.

Examples of the organic pigments in the present invention may include the following pigments.

C.I. Pigment Yellow 1, 1:1, 2 to 6, 9, 10, 12 to 14, 16, 17, 24, 31, 32, 34, 35, 35:1, 36, 36:1, 37, 37:1, 40 to 43, 48, 53, 55, 61, 62, 62:1, 63, 65, 73 to 75, 81, 83, 87, 93 to 95, 97, 100, 101, 104, 105, 108 to 111, 116, 117, 119, 120, 126, 127, 127:1, 128, 129, 133, 134, 136, 138, 139, 142, 147, 148, 150, 151, 153 to 155, 157 to 170, 172 to 176, 180 to 185, 188 to 191, 191:1, 192 to 200, and 202 to 208;

C.I. Pigment Orange 1, 2, 5, 13, 16, 17, 19 to 24, 34, 36, 38, 39, 43, 46, 48, 49, 61, 62, 64, 65, 67 to 75, and 77 to 79;

C.I. Pigment Red 1 to 9, 12, 14 to 17, 21 to 23, 31, 32, 37, 38, 41, 47, 48, 48:1 to 48:4, 49, 49:1, 49:2, 50:1, 52:1, 52:2, 53, 53:1 to 53:3, 57, 57:1, 57:2, 58:4, 60, 63, 63:1, 63:2, 64, 64:1, 68, 69, 81, 81:1 to 81:4, 83, 88, 90:1, 101, 101:1, 104, 108, 108:1, 109, 112 to 114, 122, 123, 144, 146, 147, 149, 151, 166, 168 to 170, 172 to 179, 181, 184, 185, 187, 188, 190, 193, 194, 200, 202, 206 to 210, 214, 216, 220, 221, 224, 230 to 233, 235 to 239, 242 to 245, 247, 249 to 251, 253 to 260, and 262 to 276;

C.I. Pigment Violet 1, 1:1, 2, 2:2, 3, 3:1, 3:3, 5, 5:1, 14 to 16, 19, 23, 25, 27, 29, 31, 32, 37, 39, 42, 44, 47, 49, and 50;

C.I. Pigment Blue 1, 1:2, 9, 14, 15, 15:1 to 15:4, 15:6, 16, 17, 19, 25, 27 to 29, 33, 35, 36, 56, 56:1, 60, 61, 61:1, 62, 63, 66 to 68, 71 to 76, 78, and 79;

C.I. Pigment Green 1, 2, 4, 7, 8, 10, 13 to 15, 17 to 19, 26, 36, 45, 48, 50, 51, 54, 55, and 58;

C.I. Pigment Brown 23, 25, and 26; and

C.I. Pigment Black 1.

Among the above pigments, the following pigments are preferable. However, the present invention is not limited to these pigments.

C.I. Pigment Yellow 11, 24, 108, 109, 110, 138, 139, 150, 151, 154, 167, 180, and 185;

C.I. Pigment Orange 36 and 71;

C.I, Pigment Red 122, 150, 171, 175, 177, 209, 224, 242, 254, 255, and 264;

C.I. Pigment Violet 19, 23, and 32;

C.I. Pigment Blue 15:1, 15:3, 15:6, 16, 22, 60, and 66;

C.I. Pigment Green 7, 36, 37, and 58; and

C.I. Pigment Black 1.

In the present invention, as needs arise, a fine and particle-size-regulated organic pigment may be used. Pulverization of the pigment can be achieved through a process (salt milling) which includes preparing a viscous liquid composition containing the pigment together with a water-soluble organic solvent and a water-soluble inorganic salt, and then milling the pigment.

These organic pigments may be used in various combinations for increasing color purity. Specific examples of the combinations that can be used are as follows. As a pigment of red, a mixture of a red pigment such as an anthraquinone pigment, a perylene pigment, or a diketopyrrolopyrrole pigment and a yellow pigment such as a disazo yellow pigment, isoindoline yellow pigment, or a quinophthalone yellow pigment, and a mixture of red pigments such as a perylene red pigment, an anthraquinone red pigment, or a diketopyrrolopyrrole red pigment may be used. As a pigment of green, a mixture of a halogenated phthalocyanine pigment and a disazo yellow pigment, a quinophthalone yellow pigment, an azomethine yellow pigment, or an isoindoline yellow pigment may be used. As a pigment of blue, a mixture of a phthalocyanine pigment and a dioxazine violet pigment may be used.

The present invention is not limited to a light-shielding polymerizable composition, but particularly, the effect of the invention can be demonstrated in the formation of a light-shielding pattern, and a rectangular pattern can be formed. As the coloring agent used for the light-shielding polymerizable composition, the above-described pigments and dyes described below may be used alone or in a combination of plural of them to give light-shielding properties. As a preferable pigment as the coloring agent of the light-shielding polymerizable composition, carbon black, graphite, titanium black, iron oxide, and titanium oxide may be used alone or a mixture of them may be used, and particularly, when titanium black is used, high light-shielding properties can be ensured in a region of from ultraviolet to infrared, which is preferable.

<Pigment Dispersion Composition>

The pigment which is a coloring agent in the present invention is preferably prepared in advance as a pigment dispersion composition. The pigment dispersion composition includes a pigment, a dispersant, and a solvent, and other components may be further used as necessary. Each component is explained below in detail.

(Dispersant)

As the dispersant, for example, a dispersant appropriately selected from known pigment dispersants and surfactants may be used.

Specifically, various compounds can be used. Specific examples of such dispersant include cationic surfactants such as organosiloxane polymer KP341 (trade name, manufactured by Shin-Etsu Chemical Co., Ltd.), (meth)acrylic acid based (co)polymer POYFLOW No. 75, No. 90, and No. 95 (all trade names, manufactured by Kyoeisha Chemical Co., Ltd.), and W001 (trade name, manufactured by Yusho Co., Ltd.); nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as W004, W005, and W017 (all trade names, manufactured by Yusho Co., Ltd.); polymer dispersants such as EFKA-46, EFKA-47, EFKA-47EA, EFKA POLYMER 100, EFKA POLYMER 400, EFKA POLYMER 401, and EFKA POLYMER 450 (all trade names, manufactured by Ciba Specialty Chemicals Corporation), DISPERSE AID 6, DISPERSE AID 8, DISPERSE AID 15, and DISPERSE AID 9100 (all trade names, manufactured by San Nopco Limited); various Solsperse dispersants such as SOLSPERSE 3000, 5000, 9000, 12000, 13240, 13940, 17000, 24000, 26000, and 28000 (all trade names, manufactured by The Lubrizol Corporation, Japan); ADEKA PLURONIC L31, F38, L42, L44, L61, L64, F68, L72, P95, F77, P84, F87, P94, L101, P103, F108, L121, and P-123 (all trade names, manufactured by Asahidenka Co., Ltd.); ISONET S-20 (trade name, manufactured by Sanyo Chemical Industries); and DISPERBYK 101, 103, 106, 108, 109, 111, 112, 116, 130, 140, 142, 162, 163, 164, 166, 167, 170, 171, 174, 176, 180, 182, 2000, 2001, 2050, and 2150 (all trade names, manufactured by BYK Chemie Japan K.K.). Other than these examples, oligomers and polymers having a polar group at a terminal of the molecule or in a side chain thereof, such as acrylic copolymers are described.

It is necessary that the polymer compound for coating pigment, which is used as a dispersant, is in a solid state at room temperature, insoluble in water, and simultaneously, soluble in a water-soluble organic solvent which is used as a wetting agent at the time of salt milling. A natural resin, a modified natural resin, a synthetic resin, or a synthetic resin modified by a natural resin may be used as the polymer compound for coating pigment. As the natural resin, rosin is representative. Examples of the modified natural resin include rosin derivatives, cellulose derivatives, rubber derivatives, protein derivatives, and oligomers thereof. Examples of the synthetic resin include an epoxy resin, an acrylic resin, a maleic resin, a butyral resin, a polyester resin, a melamine resin, a phenol resin, and a polyurethane resin. Examples of the synthetic resin modified by a natural resin include a rosin-modified maleic resin and a rosin-modified phenol resin.

Examples of the synthetic resin include polyamidoamine and salts thereof, polycarboxylic acid and salts thereof, high molecular weight unsaturated acid esters, polyurethane, polyester, poly(meth)acrylate, (meth)acrylic copolymer, and naphthalenesulfonic acid-formalin condensates.

Concerning the timing of adding the resin, the entire amount of the resin may be added at the beginning of the salt milling, or the resin may be divided and added.

In the case of using titanium black as the pigment in the present invention, it is preferable to use a resin having a graft chain and an acid group as the dispersant from the viewpoint of dispersion stability and developability. As the acid group, a carboxylic acid group, a sulfonic acid group, and a phosphoric acid group are preferable, and a carboxylic acid group or phosphoric acid group which is linked to the main chain of the polymer, that is the dispersant, through an ester group or a methylene group is more preferable. Examples of the graft chain include a polymer of a (meth)acrylic acid derivative, a polyester chain, and a polymer of a styrene derivative.

Specifically, the following graft copolymer (hereinafter, also referred to as "dispersion resin") is preferably used as the dispersant for titanium black.

[Dispersion Resin]

The graft copolymer which can be used as a dispersant in the present invention preferably has a graft chain in which the number of atoms other than hydrogen atoms is in a range of from 40 to 10,000. The graft chain in this case means a portion from the root of the main chain of the copolymer to the terminal of the group branching from the main chain.

In the pigment dispersion composition, the graft copolymer is a dispersion resin which is used to impart dispersibility to titanium black. Since the graft copolymer has excellent dispersibility and affinity to the solvent due to the existence of the graft chain, the graft copolymer is excellent in dispersibility with respect to titanium black and dispersion stability over time. Further, when the graft copolymer is included in the polymerizable composition, since the graft copolymer has affinity to a polymerizable compound or other resin, which can be used in combination, due to the existence of the graft chain, residues hardly generate during alkali development.

When the graft chain is longer, steric repulsion effect may be enhanced and dispersibility may be improved. However, when the graft chain is too long, adsorption force with respect to titanium black may be lowered, and dispersibility may be lowered. Therefore, the graft copolymer used in the present invention preferably has the number of atoms other than hydrogen atoms of from 40 to 10,000 per one graft chain, more preferably has the number of atoms other than hydrogen atoms of from 50 to 2,000 per one graft chain, and even more preferably has the number of atoms other than hydrogen atoms of from 60 to 500 per one graft chain.

Concerning the polymer structure of the graft chain, poly (meth)acryl, polyester, polyurethane, polyurea, polyamide, polyether, or the like may be used. For the purpose of enhancing the interaction property of the graft moiety with the solvent, and thereby enhancing the dispersibility, a poly(meth) acryl structure or a graft chain having poly(meth)acryl, polyester, or polyether is preferable, and a graft chain having polyester or polyether is more preferable.

The structure of macromonomer having such a polymer structure as the graft chain is not particularly limited as long as the macromonomer has a substituent which can react with a main chain portion of the polymer and simultaneously satisfies the necessary conditions of the invention. Preferably, a macromonomer having a reactive double-bond group can be suitably used.

Examples of a commercially available macromonomer which is preferably used for synthesizing the graft copolymer include AA-6, AA-10, AB-6, AS-6, AN-6, AW-6, AA-714, AY-707, AY-714, AK-5, AK-30, and AK-32 (all trade names, manufactured by Toagosei Co., Ltd.), and BLEMMER PP-100, BLEMMER PP-500, BLEMMER PP-800, BLEMMER PP-1000, BLEMMER 55-PET-800, BLEMMER PME-4000, BLEMMER PSE-400, BLEMMER PSE-1300, and BLEMMER 43PAPE-600B (all trade names, manufactured by NOF Corporation). Among them, AA-6, AA-10, AB-6, AS-6, AN-6, BLEMMER PME-4000 (all trade names), or the like is preferably used.

In addition to the above macromonomers, examples of the macromonomer which is preferably used include macromonomers having, at the terminal of polyester, a polymerizable group such as an acryl group, a methacryl group, an acrylamido group, a methacrylamido group, a styryl group, or the like. Further, for the formation of polyester, caprolactone is preferably used.

Into the graft copolymer, other than the graft moiety, a functional group that can form interaction with titanium black can be introduced. Examples include a structural unit having an acid group, a structural unit having a basic group, a structural unit having a coordinating group, and a structural unit having a reactive group.

Examples of the acid group of the structural unit include a carboxylic acid group, a sulfonic acid group, a phosphoric acid group, and a phenolic hydroxy group. A carboxylic acid group, which has a good adsorption force with respect to titanium black and simultaneously has high dispersibility, is particularly preferable. One of these acid groups may be used alone or two or more of them may be used in combination. By introducing such an acid group, the graft copolymer has the advantage of improving alkali developability of the graft copolymer.

Specific examples of acids which can be used as the structural unit having an acid group are shown below, while the scope of the invention is not limited thereto. Specific examples include methacrylic acid, crotonic acid, isocrotonic acid, a reaction product of a compound having an addition polymerizable double bond and a hydroxy group in the molecule (for example, 2-hydroxyethyl methacrylate) and succinic anhydride, a reaction product of a compound having an addition polymerizable double bond and a hydroxy group in the molecule and phthalic anhydride, a reaction product of a compound having an addition polymerizable double bond and a hydroxy group in the molecule and tetrahydroxyphthalic anhydride, a reaction product of a compound having an addition polymerizable double bond and a hydroxy group in the molecule and trimellitic anhydride, a reaction product of a compound having an addition polymerizable double bond and a hydroxy group in the molecule and pyromellitic anhydride, acrylic acid, acrylic acid dimer, an acrylic acid oligomer, maleic acid, itaconic acid, fumaric acid, 4-vinylbenzoic acid, vinyl phenol, and 4-hydroxyphenyl methacrylamide.

The content of the "structural unit having an acid group" contained in the graft copolymer is preferably from 0.1 mol % to 50 mol %. From the viewpoint of suppression of damages to the image strength due to alkali development, the content is particularly preferably from 1 mol % to 30 mol %.

Examples of the basic group of the structural unit include a primary amino group, a secondary amino group, a tertiary amino group, a heterocycle containing an N (nitrogen) atom, and an amido group. A tertiary amino group, which has a good adsorption force with respect to the pigment and simultaneously has high dispersibility, is particularly preferable. One or one or more of these groups may be used. The content of the "structural unit having a basic group" contained in the graft copolymer according to the present invention is preferably from 0.01 mol % to 50 mol %. From the viewpoint of suppression of developability inhibition, the content is particularly preferably from 0.01 mol % to 30 mol %.

Examples of the coordinating group in the structural unit having a coordinating group, or the reactive group in the structural unit having a reactive group include an acetylacetoxy group, a trialkoxysilyl group, isocyanato group, a group derived from an acid anhydride, and a group derived from an acid chloride. An acetylacetoxy group, which has a good adsorption force with respect to the pigment and has high dispersibility, is particularly preferable. One or one or more of these groups may be used. The total content of the "structural unit having a coordinating group" and "structural unit having a reactive group" contained in the graft copolymer according to the present invention is preferably from 0.5 mol % to 50 mol %. From the viewpoint of suppression of developability inhibition, the total content is particularly preferably from 1 mol % to 30 mol %.

Further, the graft copolymer contained in the titanium black dispersion composition can further include other structural units having various functions, for example, a structural unit having a functional group having affinity to a dispersion medium used in the dispersion or the like, as a copolymerization component, in addition to the structural unit having a graft moiety and the functional group that can form interaction with titanium black, for the purpose of improvement in various performance such as image strength and the like, as long as the other structural units do not spoil the effect of the invention.

In the graft copolymer, examples of the copolymerization component capable of copolymerization include radical polymerizable compounds selected from the group consisting of acrylic acid esters, methacrylic acid esters, styrenes, acrylonitriles, methacrylonitriles, and the like. One of these copolymerization components may be used alone or two or more of them may be used in combination. In the graft copolymer, the content of the copolymerization component used is preferably from 0 mol % to 90 mol %, and particularly preferably from 0 mol % to 60 mol %. When the content is within the above range, a sufficient pattern formation may be obtained.

Examples of the solvent which is used at the time of synthesis of the graft copolymer include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used alone or as a mixture of two or more of them.

Specific examples of such a graft copolymer include the following exemplary compounds 1 to 54. Note that, the added number (wt %) at each structural unit (in the main chain portion) is based on mass.

(Exemplary compound 1)

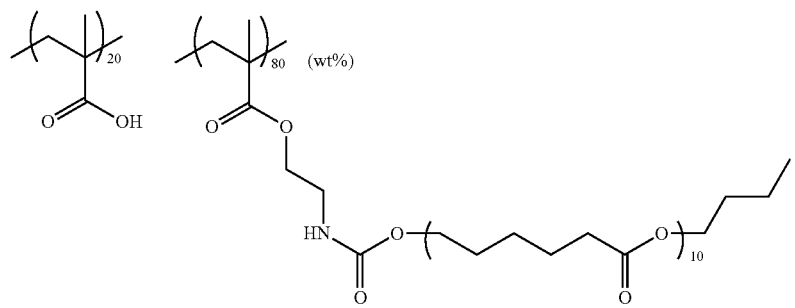

-continued
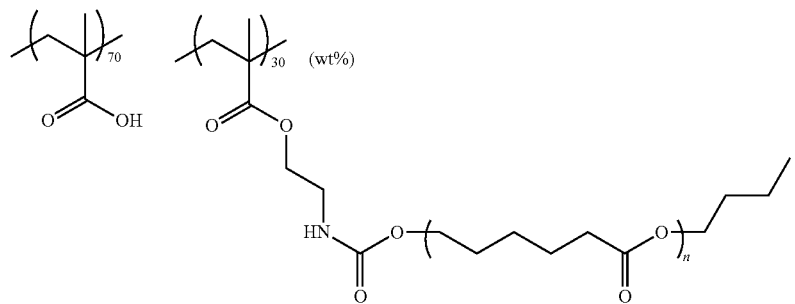
(Exemplary compound 2)
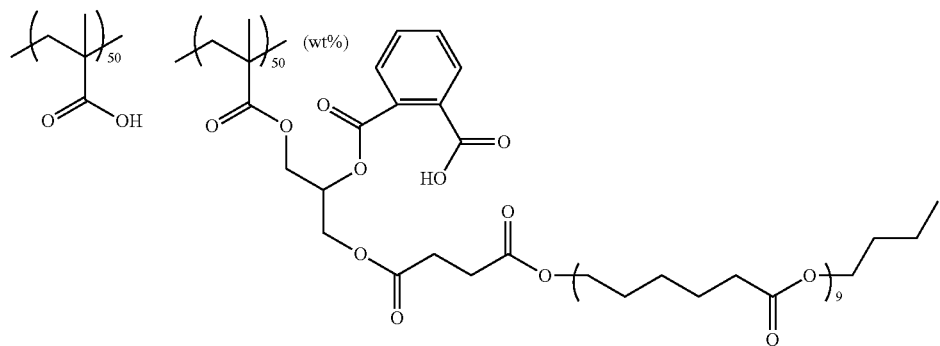
(Exemplary compound 3)
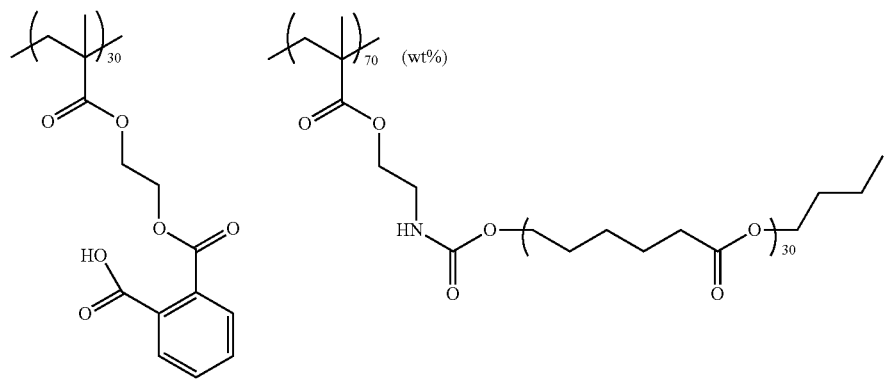
(Exemplary compound 4)
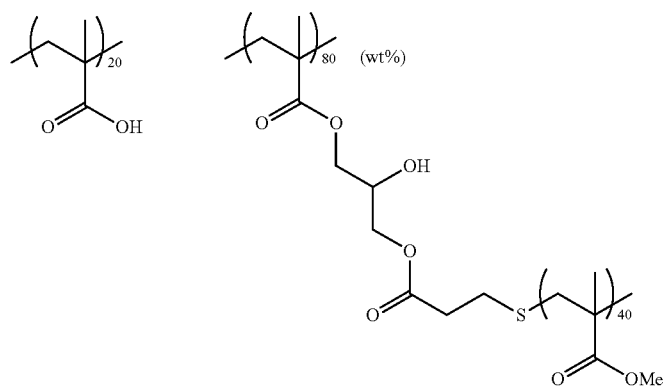
(Exemplary compound 5)

(Exemplary compound 6)
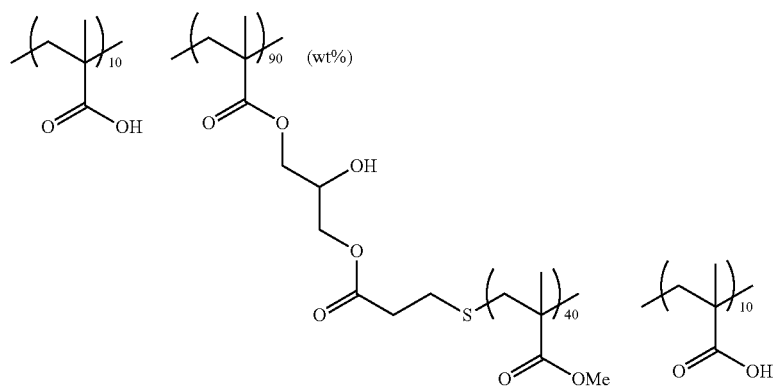
(Exemplary compound 7)
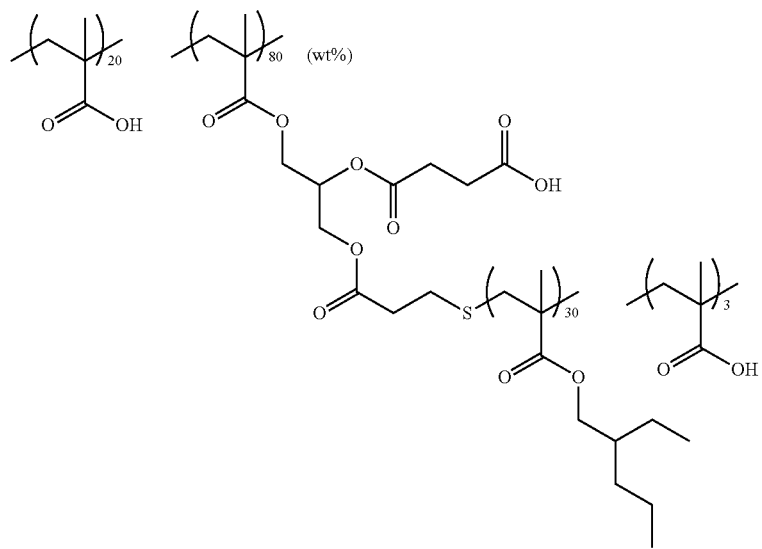
(Exemplary compound 8)
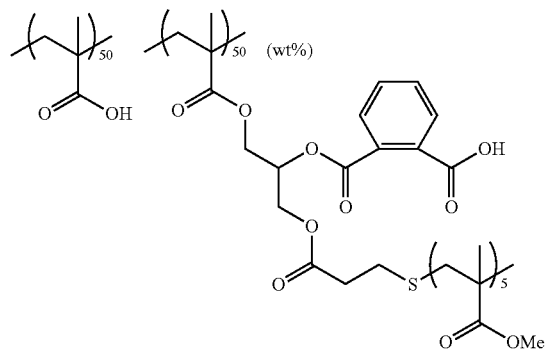
(Exemplary compound 9)
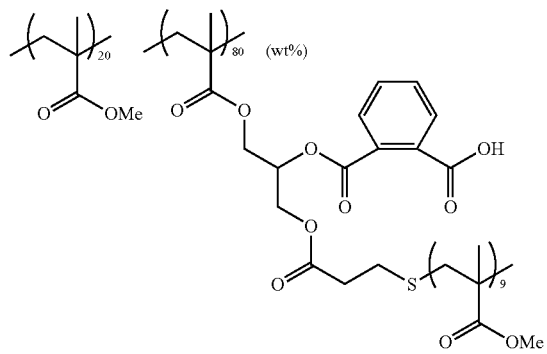

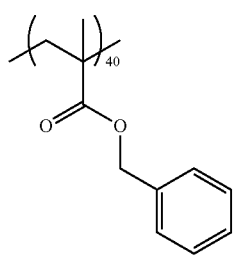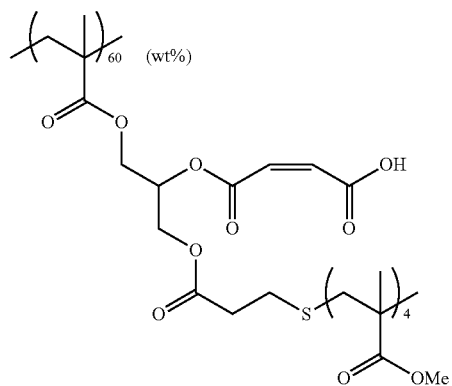
(Exemplary compound 10)
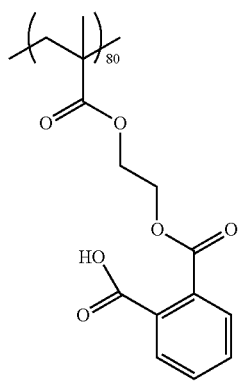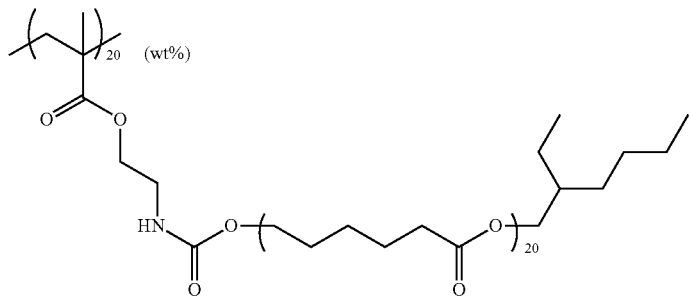
(Exemplary compound 11)
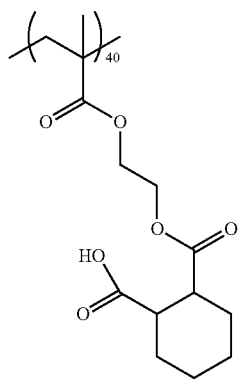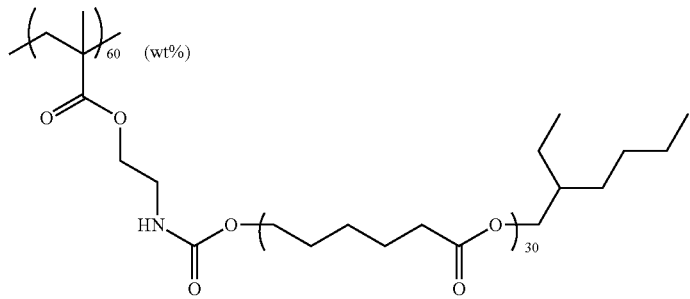
(Exemplary compound 12)
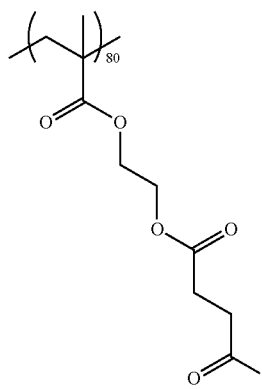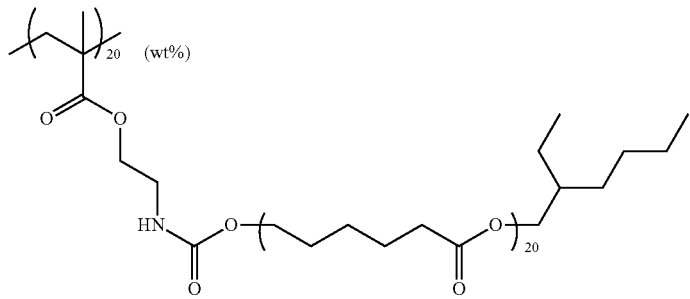
(Exemplary compound 13)

-continued
(Exemplary compound 14)
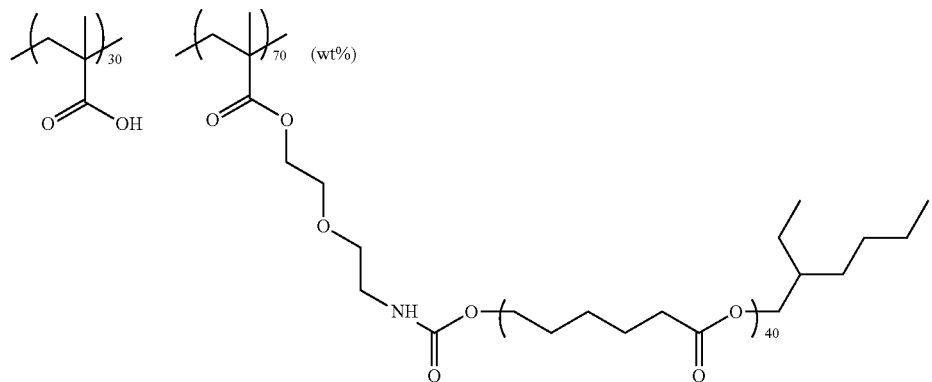
(Exemplary compound 15)
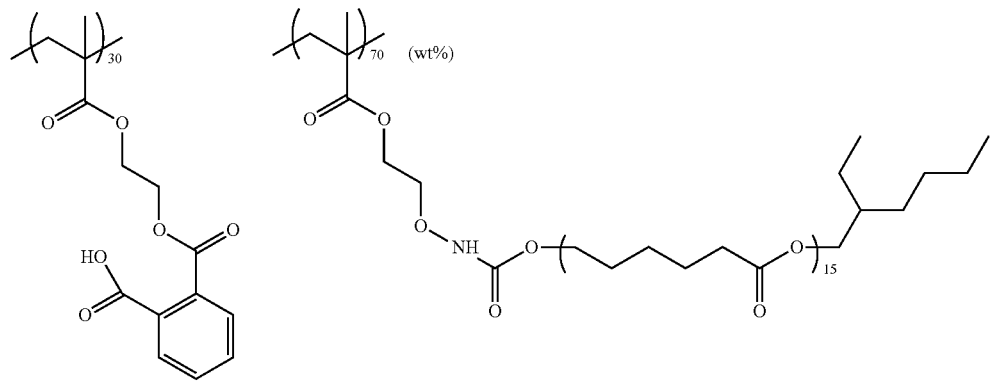
(Exemplary compound 16)
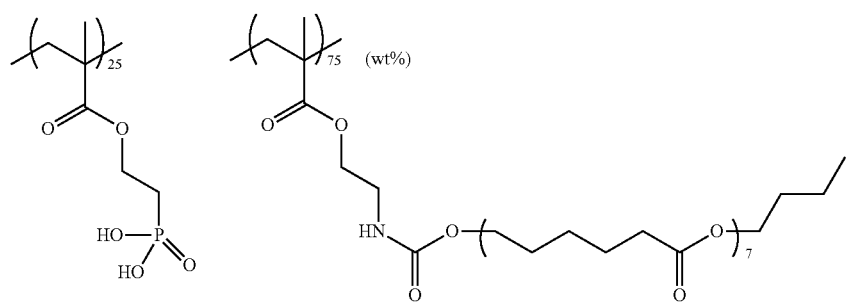
(Exemplary compound 17)
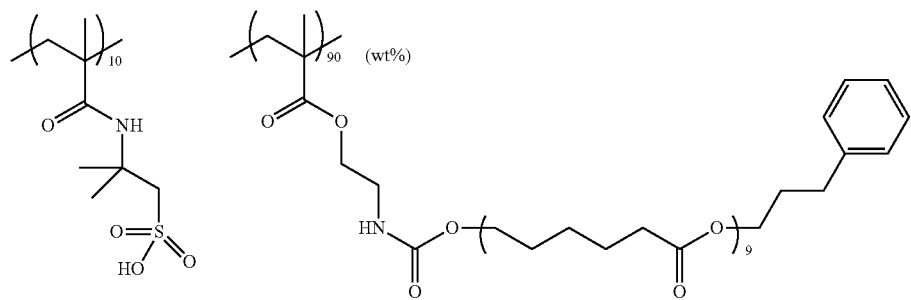

-continued
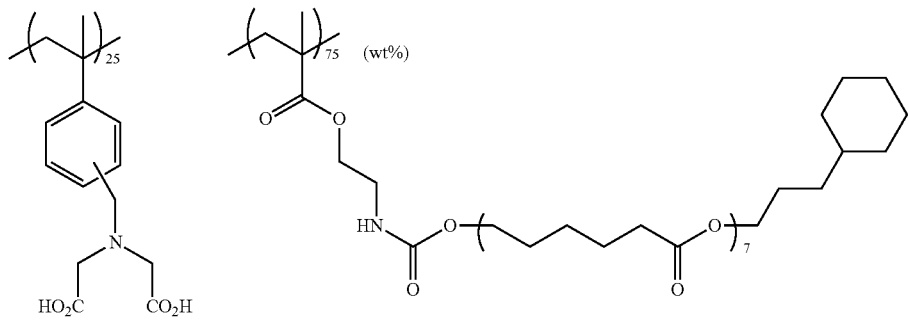
(Exemplary compound 18)
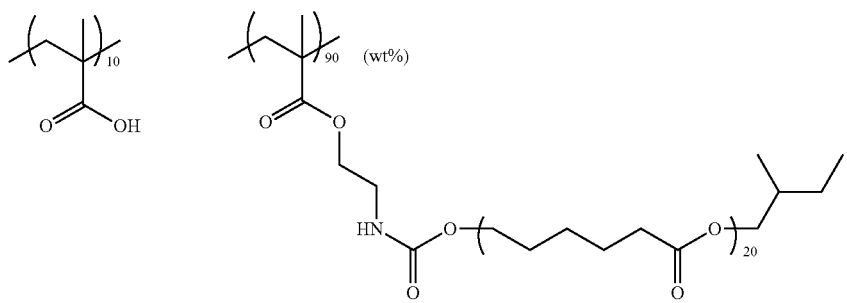
(Exemplary compound 19)
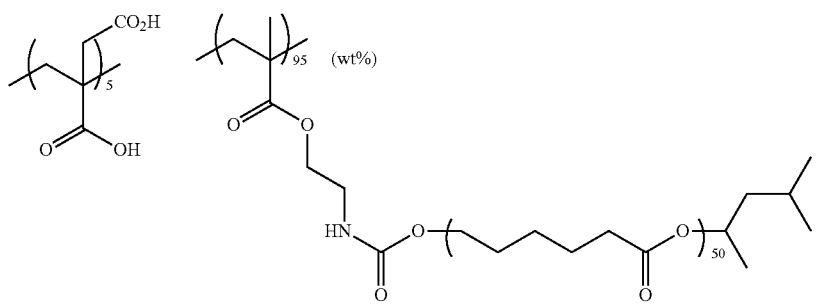
(Exemplary compound 20)
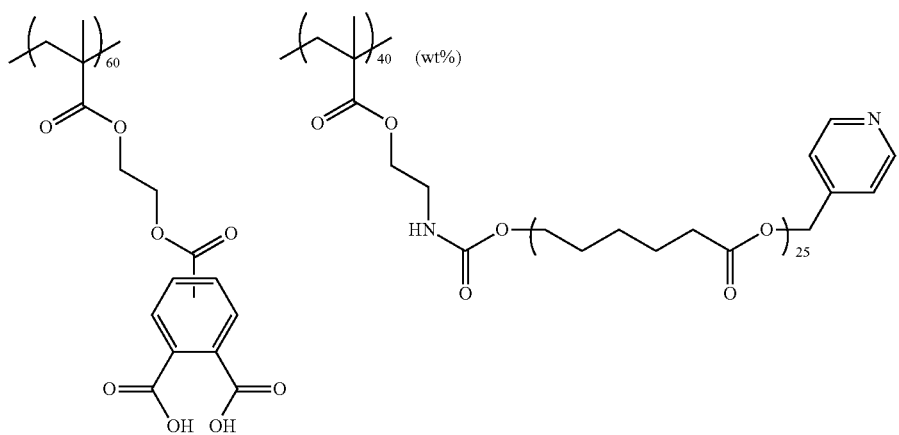
(Exemplary compound 21)

(Exemplary compound 22)
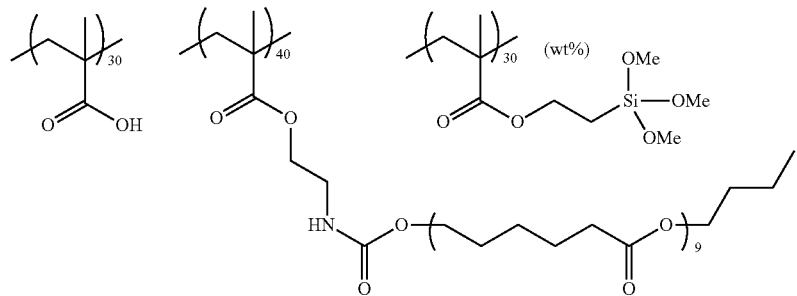
(Exemplary compound 23)
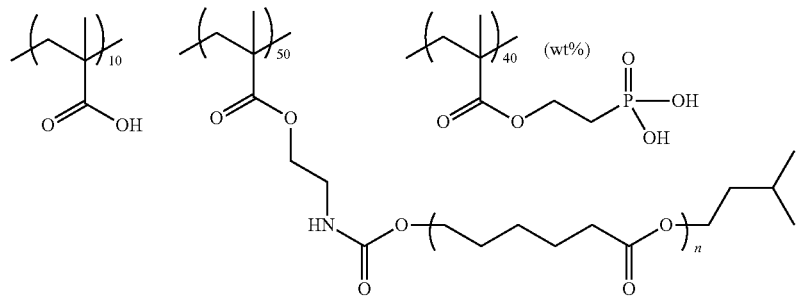
(Exemplary compound 24)
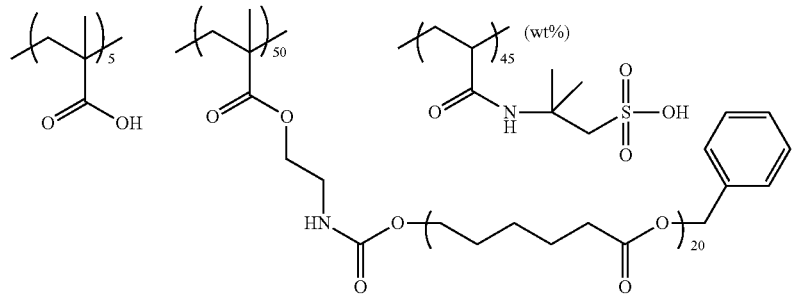
(Exemplary compound 25)
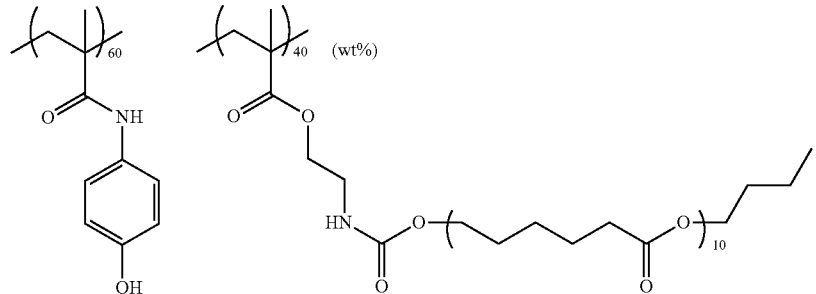
(Exemplary compound 26)
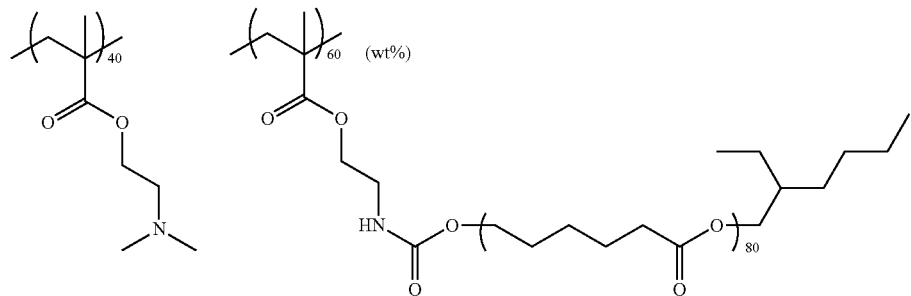

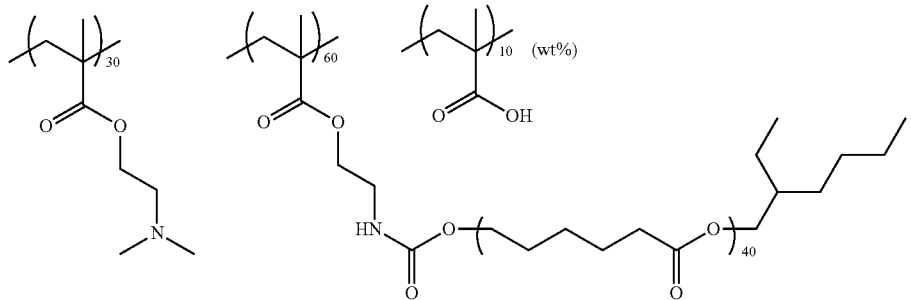
(Exemplary compound 27)
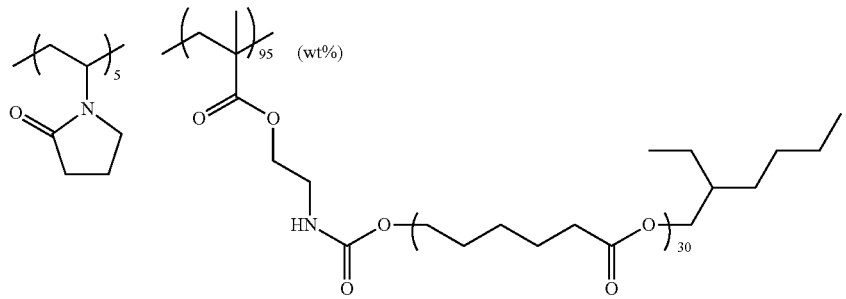
(Exemplary compound 28)
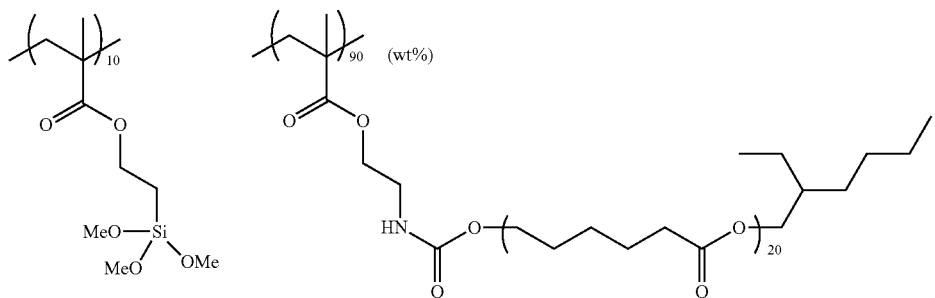
(Exemplary compound 29)
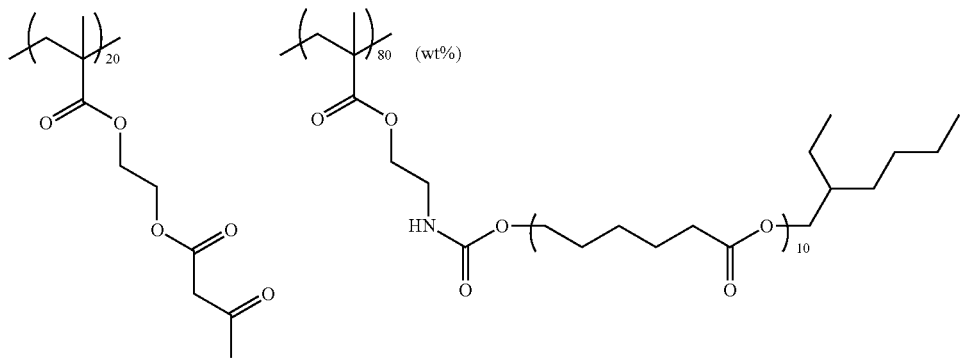
(Exemplary compound 30)
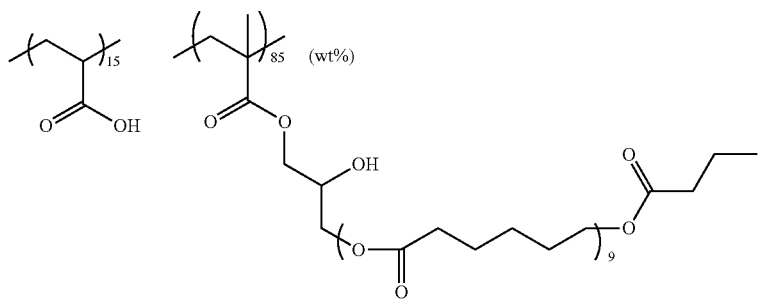
(Exemplary compound 31)

-continued
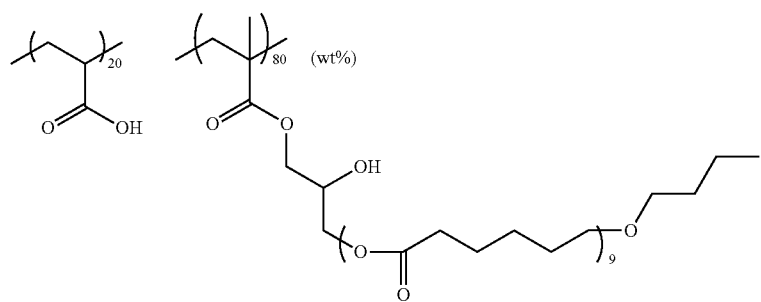
(Exemplary compound 32)
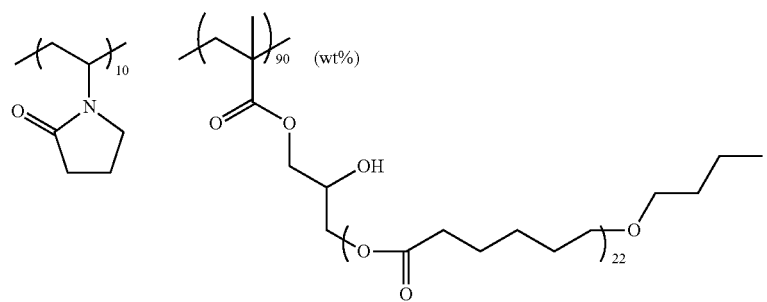
(Exemplary compound 33)
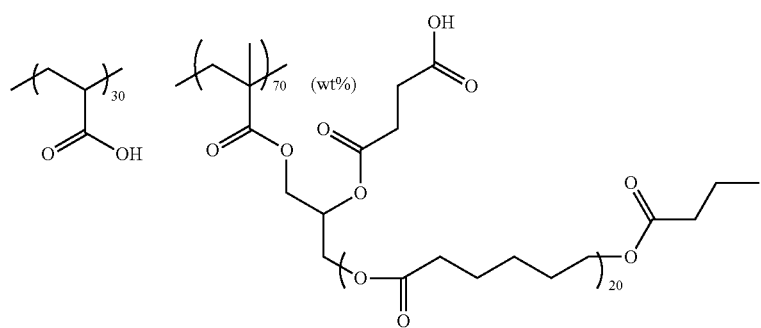
(Exemplary compound 34)
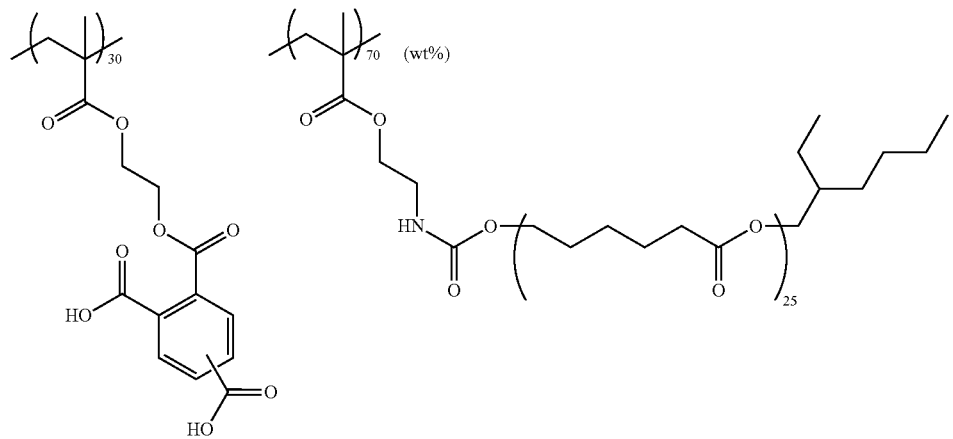
(Exemplary compound 35)

-continued
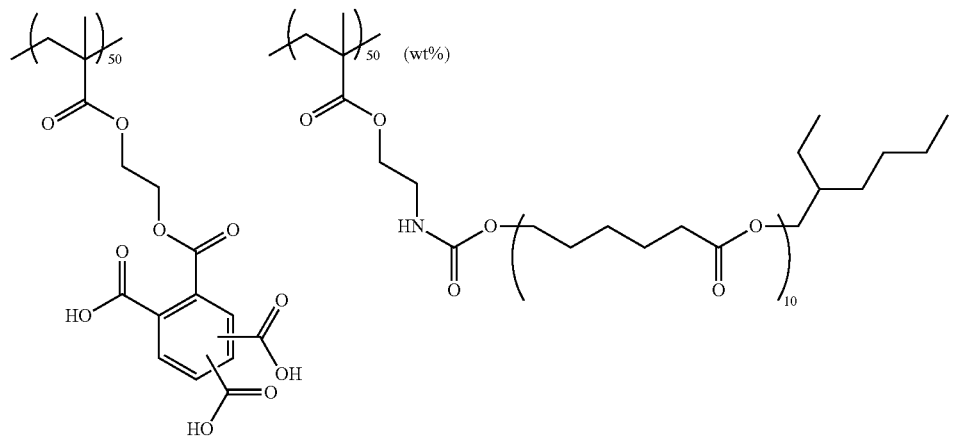
(Exemplary compound 36)
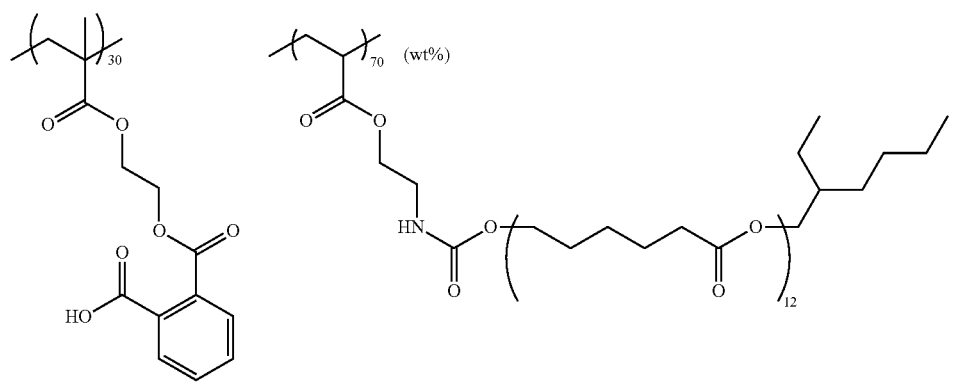
(Exemplary compound 37)
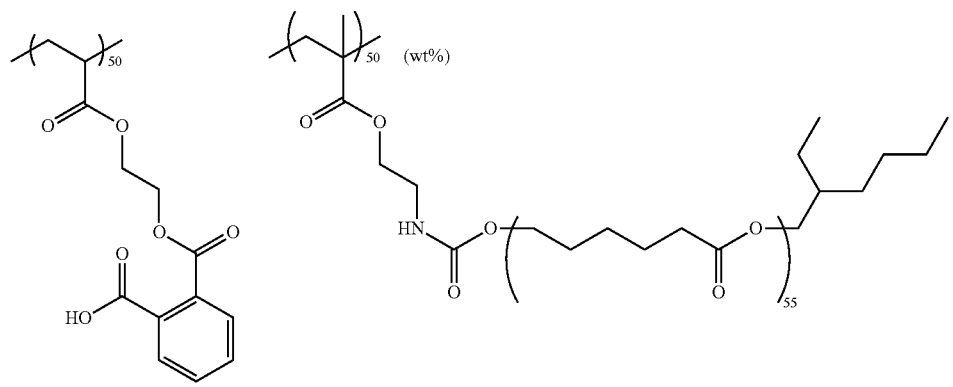
(Exemplary compound 38)
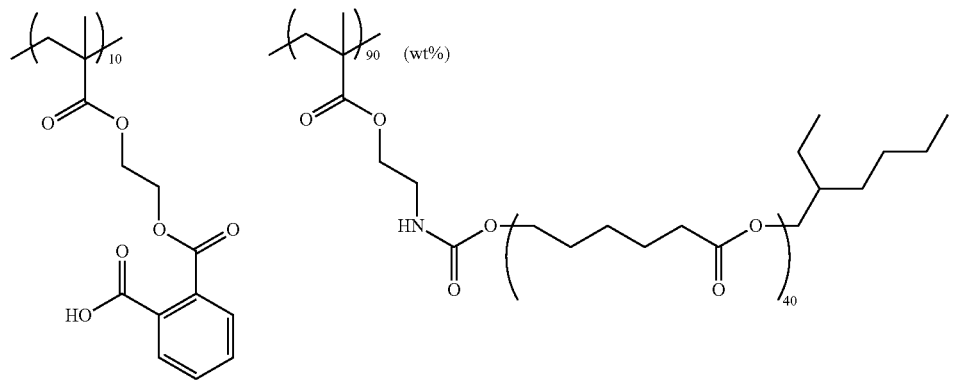
(Exemplary compound 39)

(Exemplary compound 40)
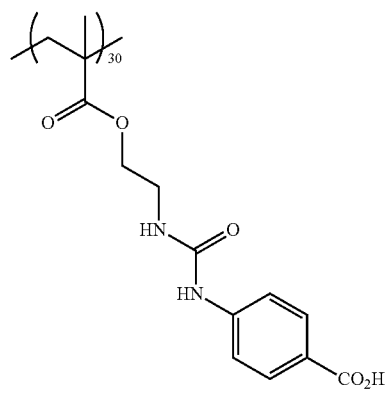
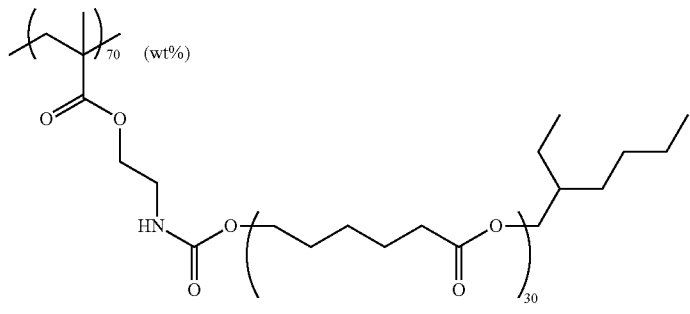
(Exemplary compound 41)
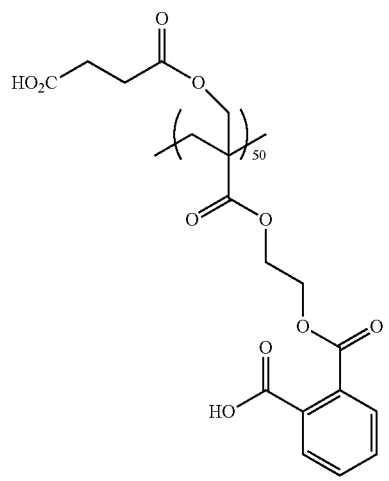
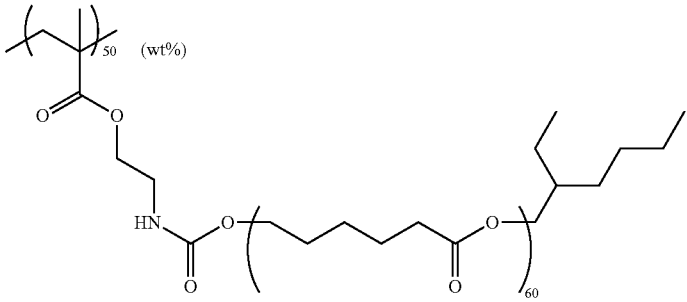
(Exemplary compound 42)
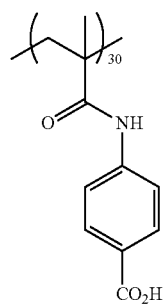
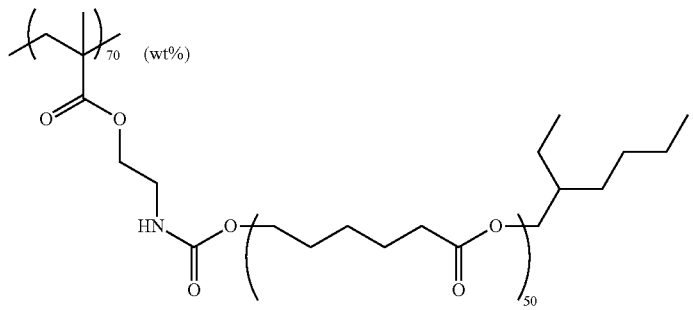

(Exemplary compound 43)
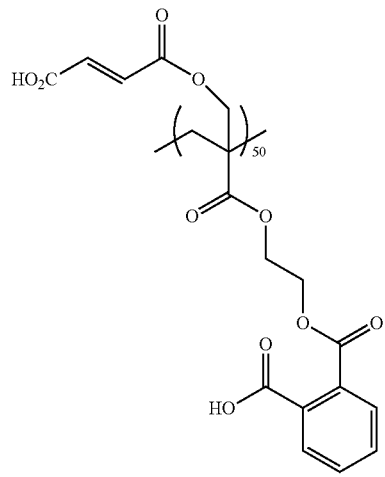 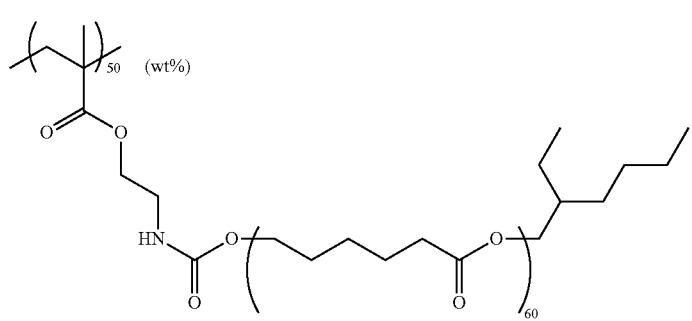
(Exemplary compound 44)
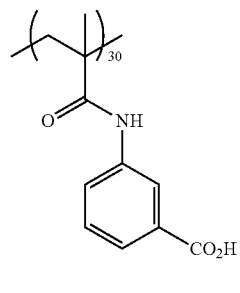 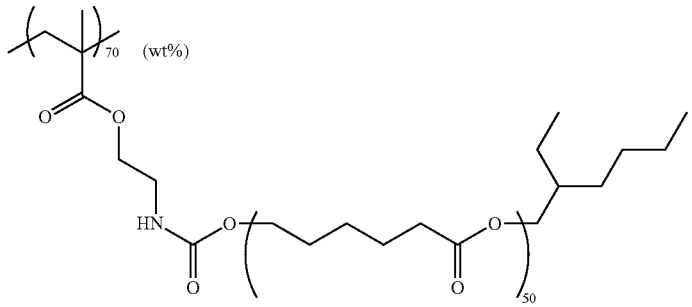
(Exemplary compound 45)
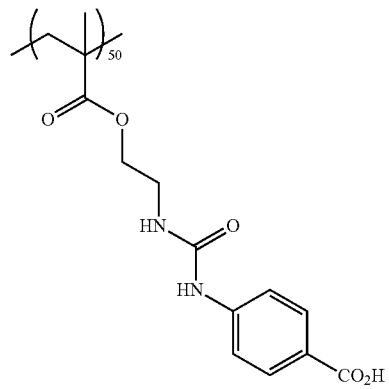 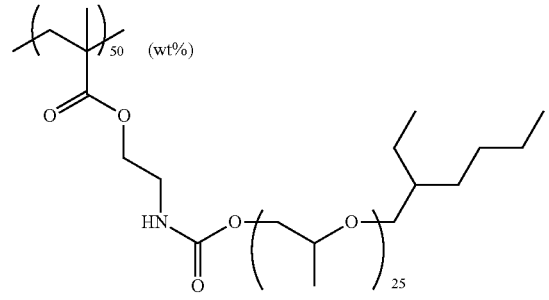
(Exemplary compound 46)
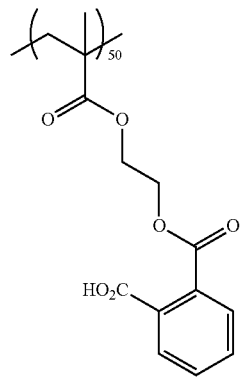 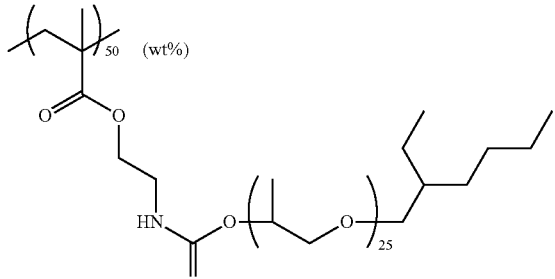

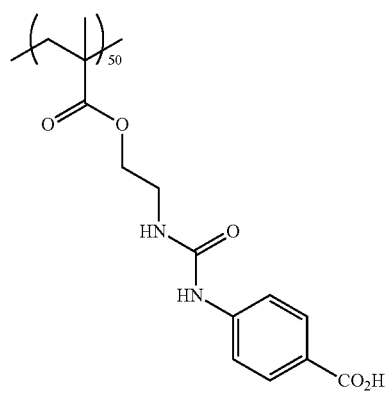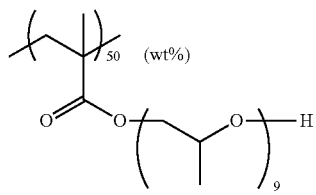
(Exemplary compound 47)
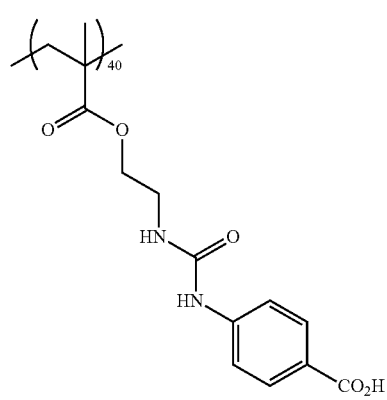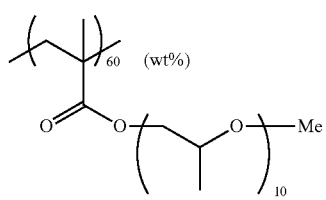
(Exemplary compound 48)
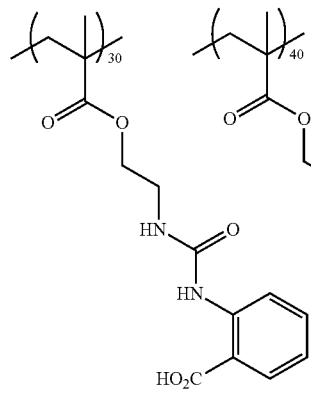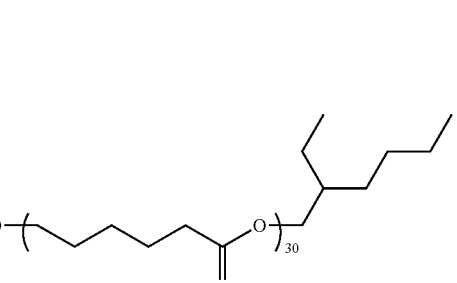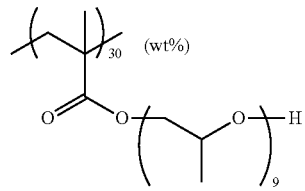
(Exemplary compound 49)
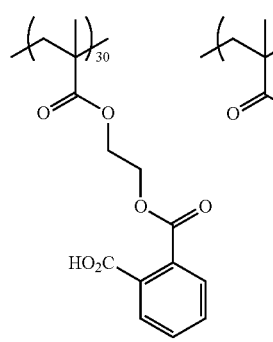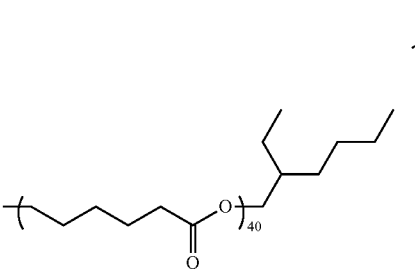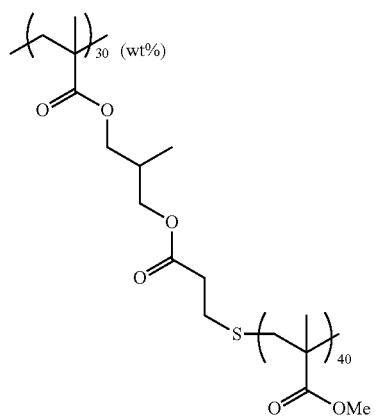
(Exemplary compound 50)

-continued

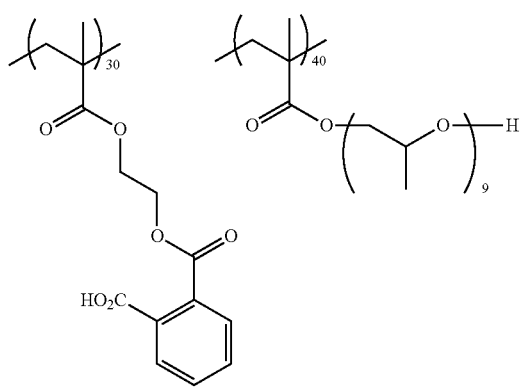

(Exemplary compound 51)

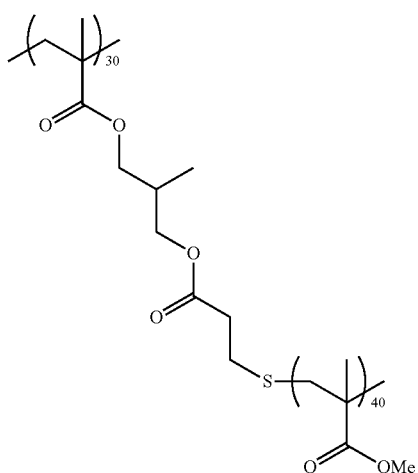

(Exemplary compound 52)

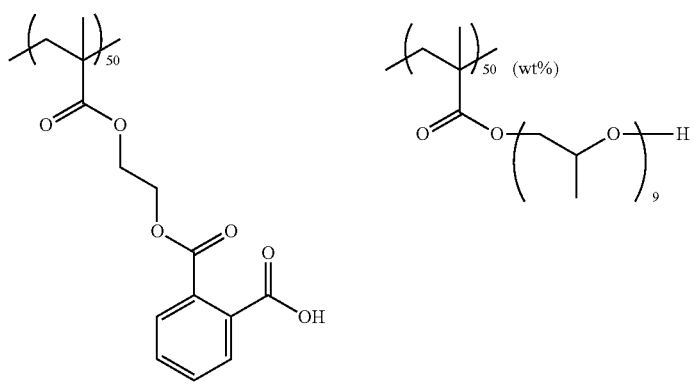

(Exemplary compound 53)

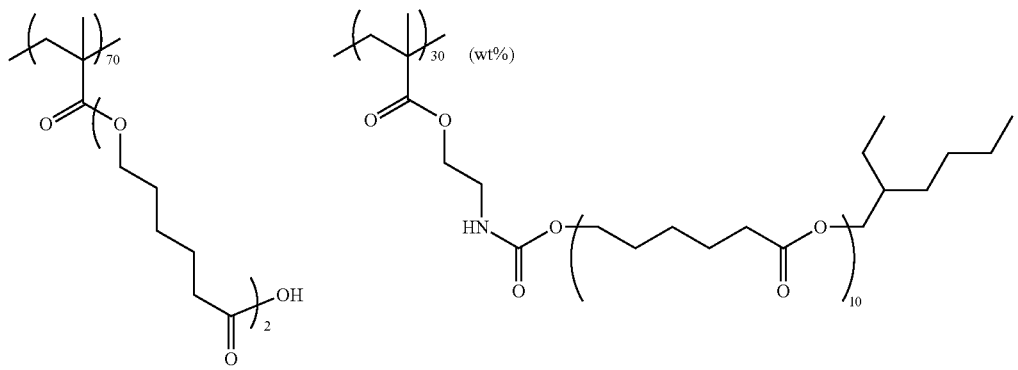

The weight average molecular weight of the dispersion resin is preferably from 10,000 to 300,000, more preferably from 15,000 to 200,000, even more preferably from 20,000 to 100,000, and particularly preferably from 25,000 to 50,000, from the viewpoints of suppression of pattern peeling at the time of development and developability. Note that, the weight average molecular weight may be measured by, for example, GPC (gel permeation chromatography).

One of the dispersion resins may be used alone or two or more of them may be used in combination.

The content of the dispersant in the pigment dispersion composition is preferably from 1% by mass to 100% by mass, and more preferably from 3% by mass to 70% by mass, with respect to the mass of the pigment described above.

Further, a polymer compound for coating the pigment may be added to the pigment dispersion composition according to the present invention.

The pigment dispersion composition contains a solvent. The solvent is selected in view of solubility of each component contained in the pigment dispersion composition, coatability in the case of being applied to a polymerizable composition, or the like, and esters, ethers, ketones, or aromatic hydrocabons are used. Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, and propylene glycol monomethyl ether acetate are preferable.

The content of the solvent in the pigment dispersion composition is preferably from 50% by mass to 95% by mass, and more preferably from 70% by mass to 90% by mass.

The content of the pigment in the pigment dispersion composition in the present invention is preferably 25% by mass or more, more preferably from 30% by mass to 80% by mass, and more preferably from 35% by mass to 70% by mass, with respect to the total solid content of the pigment dispersion composition.

It is preferable that the pigment dispersion composition further contains a pigment derivative having a structure in which a part of an organic pigment is substituted by an acid group, a basic group, or a phthalimidomethyl group. Particularly, when the pigment dispersion composition contains a pigment derivative having an acid group, dispersibility and dispersion stability are improved.

Examples of the above organic pigment include a diketopyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment. As the acid group, sulfonic acid, carboxylic acid, and quaternary ammonium salts thereof are preferable. As the basic group, an amino group is preferable. The addition amount of the pigment derivative is preferably from 1% by mass to 50% by mass, and more preferably from 3% by mass to 30% by mass, with respect to the pigment.

(Other Component)

To the pigment dispersion composition, other polymer materials [examples include polyamidoamine and a salt thereof, polycarboxylic acid and a salt thereof, a high molecular weight unsaturated acid ester, a modified polyurethane, a modified polyester, a modified poly(meth)acrylate, a (meth) acrylic copolymer, and a naphthalenesulfonic acid-formalin condensate] can be further added, in addition to the above components, from the viewpoints of improvement in dispersion stability, control of developability, and the like. Such a polymer material adsorbs onto the surface of a pigment and acts so as to prevent re-aggregation, and therefore, a terminal modified type polymer, a graft type polymer, and a block type polymer, each of which has an anchoring moiety to the surface of the pigment, are preferable. An example is a graft copolymer including a monomer containing a heterocycle and a polymerizable oligomer having an ethylenically unsaturated bond, as copolymerization units. Examples of the other polymer materials include a polyamidoamine phosphoric acid salt, a high molecular weight unsaturated polycarboxylic acid, a polyether ester, an aromatic sulfonic acid-formalin polycondensate, polyoxyethylene nonylphenyl ether, polyester-amine, polyoxyethylene sorbitan monooleate, and polyoxyethylene sorbitan monostearate.

Concerning the method of dispersion, for example, dispersion can be carried out by mixing the pigment and the dispersant in advance and dispersing the mixture using a homogenizer or the like in advance, and then finely dispersing the resulting dispersion using a bead dispersing apparatus or the like (for example, DISPERMAT (trade name, manufactured by GETZMANN GmbH) employing zirconia beads or the like. The time for dispersion is preferably from about 3 hours to about 6 hours.

In the present invention, a dye may be also used as a coloring agent. Further, the above-described pigment and a dye may be used together as a coloring agent. In the case of using a dye, a polymerizable composition which is uniformly dissolved can be obtained.

The dye that can be used as a coloring agent is not particularly limited, and known dyes conventionally used in color filters can be used. Examples of the dye include those described in the specifications of JP-A Nos. 64-90403, 64-91102, 1-94301, 6-11614, 5-333207, 6-35183, 6-51115, 6-194828, 8-211599, 4-249549, 10-123316, 11-302283, 7-286107, 2001-4823, 8-15522, 8-29771, 8-146215, 11-343437, 8-62416, 2002-14220, 2002-14221, 2002-14222, 2002-14223, 8-302224, 8-73758, 8-179120, and 8-151531, Japanese Patent No. 2592207, U.S. Pat. Nos. 4,808,501, 5,667,920 and 5,059,500, and the like.

Examples of the chemical structure of the dye that can be used include pyrazole azo, anilino azo, triphenylmethane, anthraquinone, anthrapyridone, benzylidene, oxonol, pyrazolotriazole azo, pyridone azo, cyanine, phenothiazine, pyrrolopyrazole azomethine, xanthene, phthalocyanine, benzopyrane, and indigo.

The effect of the invention becomes more remarkable when the transmittance or polymerizability at the surface and that at the depth (a lower layer portion) of the colored layer are different. The effect of the invention is remarkable when the content of the organic pigment or dye, which is a coloring component, is 25% by mass or more, with respect to the solid content of the polymerizable composition. The effect of the invention becomes more remarkable when the content is 30% by mass or more.

Moreover, from the viewpoint of polymerizability at the surface of the colored layer and at the depth (a lower layer portion) of the colored layer, the effect can be remarkably recognized when a black pigment, particularly titanium black, is used.

<(A) Polymerizable Compound>

As the polymerizable compound, compounds which have at least one addition polymerizable ethylenically unsaturated group and have a boiling point of 100° C. or higher under the atmospheric pressure are preferable. Among them, tetra- or higher-functional (meth)acrylate compounds are preferable.

In the present specification, "(meth)acrylic acid" is a general term for acrylic acid and methacrylic acid, and "(meth) acrylate" is a general term for acrylate and methacrylate.

Examples of the compounds which have at least one addition polymerizable ethylenically unsaturated group and have a boiling point of 100° C. or higher under the atmospheric pressure include monofunctional acrylates or methacrylates such as polyethylene glycol mono(meth)acrylate, polypropylene glycol mono(meth)acrylate, and phenoxyethyl(meth) acrylate; and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth) acrylate, dipentaerythritol hexa(meth)acrylate, hexanediol (meth)acrylate, trimethylolpropane tri(acryloyloxy propyl) ether, tri(acryloyloxy ethyl)isocyanurate, compounds obtained by (meth)acrylation after adding ethylene oxide or propylene oxide to a polyfunctional alcohol such as glycerin or trimethylolethane, compounds obtained by poly(meth) acrylation of pentaerythritol or dipentaerythritol, urethane acrylates described in Japanese Patent Application Publication (JP-B) Nos. 48-41708 and 50-6034, and JP-A No. 51-37193, polyester acrylates described in JP-A No. 48-64183, and JP-B Nos. 49-43191 and 52-30490, and epoxy acrylates which are reaction products of an epoxy resin and (meth)acrylic acid.

Further, compounds which are introduced as photo-curable monomers or oligomers in "Nippon Secchaku Kyokai Shi (Journal of the Adhesion Society of Japan)" vol. 20, No. 7, pages 300 to 308 can also be used.

Further, as to the above compounds obtained by (meth) acrylation after adding ethylene oxide or propylene oxide to polyfunctional alcohol, those described as the specific examples of Formula (1) or Formula (2) in JP-A No. 10-62986 and the described compounds therein can also be used.

Above all, dipentaerythritol penta(meth)acrylate, dipentaerythritol hexa(meth)acrylate, and a structure in which an ethylene glycol residue or propylene glycol residue is present between the acryloyl groups are preferable. Oligomers thereof can also be used.

Further, urethane acrylates such as those described in JP-B Nos. 48-41708, JP-A No. 51-37193, and JP-B Nos. 2-32293 and 2-16765, and urethane compounds having an ethylene oxide skeleton described in JP-B Nos. 58-49860, 56-17654, 62-39417, and 62-39418 are also preferable. Furthermore, by using addition polymerizable compounds having an amino structure or a sulfide structure in the molecule, which is described in JP-A Nos. 63-277653, 63-260909, and 1-105238, a photo-polymerizable composition having extremely excellent photosensitization speed can be obtained, depending on use. Examples of commercially available products thereof include URETHANE OLIGOMER UAS-10 and UAB-140 (all trade names, manufactured by Sanyo Kokusaku Pulp Corp.), UA-7200 (trade name, manufactured by Shin-Nakamura Chemical Co., Ltd.), DPHA-40H (trade name, manufactured by Nippon Kayaku Co., Ltd.) and UA-306H, UA-306T, UA-306I, AH-600, T-600, and AI-600 (all trade names, manufactured by Kyoeisha Chemical Co., Ltd.).

Further, ethylenically unsaturated compounds having an acid group are also preferable, and examples of commercially available products thereof include TO-756, which is a carboxy group-containing trifunctional acrylate, and TO-1382, which is a carboxy group-containing pentafunctional acrylate (all trade names, manufactured by Toagosei Co., Ltd.).

One of the polymerizable compounds may be used alone, or two or more of them may be used in combination.

The content of the polymerizable compound in the polymerizable composition is preferably from 3 parts to 55 parts, and more preferably from 10 parts to 50 parts, with respect to 100 parts of the total solid content of the composition. When the content of the polymerizable compound is within the above range, a sufficient curing reaction may be carried out.

<(B) Polymerization Initiator>

The polymerizable composition of the present invention contains (B) a polymerization initiator, for the purpose of improving sensitivity and pattern formability. The polymerization initiator in the present invention is a compound that is decomposed by light to initiate or accelerate polymerization of the polymerizable components in the present invention, and preferably has absorption in a wavelength region of from 300 nm to 500 nm. The polymerization initiators may be used alone or in a combination of two or more of them.

As the polymerization initiator, for example, an acetophenone compound, a ketal compound, a benzophenone compound, a benzoin compound, a benzoyl compound, a xanthone compound, an active halogen compound (a triazine compound, an oxadiazole compound, or a coumarin compound), an acridine compound, a biimidazole compound, or an oxime ester compound is preferably used. Examples thereof may include active halogen compounds such as halomethyl oxadiazole described in JP-B No. 57-6096 and halomethyl-s-triazine described in JP-B No. 59-1281, JP-A No. 53-133428, and the like; aromatic carbonyl compounds of ketal, acetal, benzoin alkyl ethers, or the like described in the specifications of U.S. Pat. No. 4,318,791 and European Patent Application Laid-Open No. 88050; aromatic ketone compounds such as benzophenones described in the specification of U.S. Pat. No. 4,199,420; (thio)xanthones and acridine compounds described in the specification of FR 2456741; coumarin compounds and biimidazole compounds described in JP-A No. 10-62986; and sulfonium organoboron complexes and the like described in JP-A No. 8-015521 and the like.

Preferable examples of the polymerization initiator include, specifically, as the active halogen polymerization initiator (a triazine-, oxadiazole-, and coumarin initiator), 2,4-bis(trichloromethyl)-6-p-methoxyphenyl-s-triazine, 2,4-bis(trichloromethyl)-6-p-methoxystyryl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-bis(trichloromethyl)-s-triazine, methoxystyryl-2,6-bis(trichloromethyl)-s-triazine, 4-benzoxolane-2,6-bis(trichloromethyl)-s-triazine, 4-(o-bromo-p-N,N-(bisethoxycarbonylamino)-phenyl)-2,6-bis(chloromethyl)-s-triazine, 2-trichloromethyl-5-styryl-1,3,4-oxadiazole, 2-trichloromethyl-5-(cyanostyryl)-1,3,4-oxadiazole, 3-methyl-5-amino-((s-triazin-2-yl)amino)-3-phenylcoumarin, and 3-chloro-5-diethylamino-((s-triazin-2-yl)amino)-3-phenylcoumarin.

Examples of other polymerization initiators which can be used in the present invention include vicinal polyketaldonyl compounds, α-carbonyl compounds, acyloin ethers, aromatic acyloin compounds substituted by α-hydrocarbon, polynuclear quinone compounds, combinations of a triaryl imidazole dimer/p-aminophenyl ketone, a benzothiazole compound/a trihalomethyl-s-triazine compound, and oxime ester compounds described in JP-A No. 2000-66385.

(Oxime Compound)

In the present invention, an oxime compound is preferably used as (B) the polymerization initiator from the viewpoints of sensitivity, stability over time, and coloration at the time of post heating.

Examples of the oxime compound include 1-phenyl-1,2-propanedione-2-(o-ethoxycarbonyl)oxime, o-benzoyl-4'-(benzmercapto)benzoyl-hexyl-ketoxime, 2,4,6-trimethylphenylcarbonyl-diphenylphosphonyl oxide, a hexafluorophosphoro trialkylphenyl phosphonium salt, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of oxime ester compounds include compounds described in J. C. S. Perkin II (1979) pages 1653 to 1660, J. C. S. Perkin II (1979) pages 156 to 162, Journal of Photopolymer Science and Technology (1995) pages 202 to 232, and JP-A No. 2000-66385, and compounds described in JP-A No. 2000-80068, Japanese National Phase Publication No. 2004-534797, and JP-A No. 2006-342166.

Commercially available products thereof such as IRGACURE OXE01 (trade name, manufactured by Ciba Specialty Chemicals Corporation) and IRGACURE OXE02 (trade name, manufactured by Ciba Specialty Chemicals Corporation) are also preferably used.

Further preferably, cyclic oxime compounds described in JP-A Nos. 2007-231000 and 2007-322744 can also be used.

Most preferably, oxime compounds having a specific substituent described in JP-A No. 2007-269779, and oxime compounds having a thioaryl group described in JP-A No. 2009-191061 are described.

Specifically, a compound represented by the following Formula (C-1) is preferable as the oxime-based polymerization initiator. Note that, the oxime compound may be an oxime compound of (E) form, in which the N—O bond of the oxime is in the (E) form, or an oxime compound of (Z) form, in which the N—O bond of the oxime is in the (Z) form, or may be a mixture of the (E) form and the (Z) form.

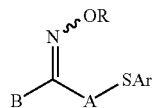

C-1

In Formula (C-1) above, R and B each independently represent a monovalent substituent, A represents a divalent organic group, and Ar represents an aryl group.

The monovalent substituent represented by R is preferably a monovalent non-metal atom group. Examples of the monovalent non-metal atom group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Moreover, the substituent may further be substituted by another substituent.

Examples of the substituent include a halogen atom, an aryloxy group, an alkoxycarbonyl group, an aryloxycarbonyl group, an acyloxy group, an acyl group, an alkyl group, and an aryl group.

The alkyl group which may have a substituent is preferably an alkyl group having from 1 to 30 carbon atoms. Specific examples thereof may include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsufanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having from 6 to 30 carbon atoms. Specific examples thereof may include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, o-, m-, and p-tolyl groups, a xylyl group, o-, m-, and p-cumenyl groups, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having from 2 to 20 carbon atoms. Specific examples thereof may include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having from 2 to 20 carbon atoms. Specific examples thereof may include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group, which may have a substituent, may include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocycle containing nitrogen, oxygen, sulfur, or phosphorus.

Specific examples thereof may include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxanthiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group, which may have a substituent, may include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group, which may have a substituent, may include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B above represents an aryl group, a heterocyclic group, an arylcarbonyl group, or a heterocyclic carbonyl group. These groups may have one or more substituents. As the substituent, the above-described substituents may be described. Further, the substituent may further be substituted by another substituent.

Among them, the following structures are particularly preferable.

In the following structures, Y, X, and n have the same definitions as Y, X, and n in Formula (C-2) described below, respectively, and so are the preferable examples.

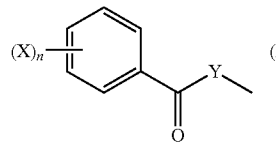 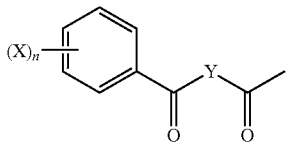

Examples of the divalent organic group represented by A above include an alkylene group, a cyclohexylene group, and an alkynylene group which have from 1 to 12 carbon atoms. These groups may have one or more substituent. As the substituent, the above-described substituents may be described. Further, the substituent may further be substituted by another substituent.

Above all, from the viewpoints of enhancing the sensitivity and suppressing coloration due to thermal aging, A preferably represents an unsubstituted alkylene group, an alkylene group substituted by an alkyl group (for example, a methyl group, an ethyl group, a t-butyl group, or a dodecyl group), an alkylene group substituted by an alkenyl group (for example, a vinyl group, or an allyl group), and an alkylene group substituted by an aryl group (for example, a phenyl group, a p-tolyl group, a xylyl group, a cumenyl group, a naphthyl group, an anthryl group, a phenanthryl group, or a styryl group).

The aryl group represented by Ar above is preferably an aryl group having 6 to 30 carbon atoms, and may have a substituent. Examples of the substituent include those which are the same as the substituents introduced into the substituted aryl groups which are described above as specific examples of the aryl group which may have a substituent.

Among them, from the viewpoints of enhancing the sensitivity and suppressing of the coloration due to thermal aging, a substituted or unsubstituted phenyl group is preferable.

In Formula (C-1), the structure of "SAr" that is formed by Ar above and the adjacent S is preferably the structure shown below, from the viewpoint of sensitivity. Note that, Me represents a methyl group, and Et represents an ethyl group.

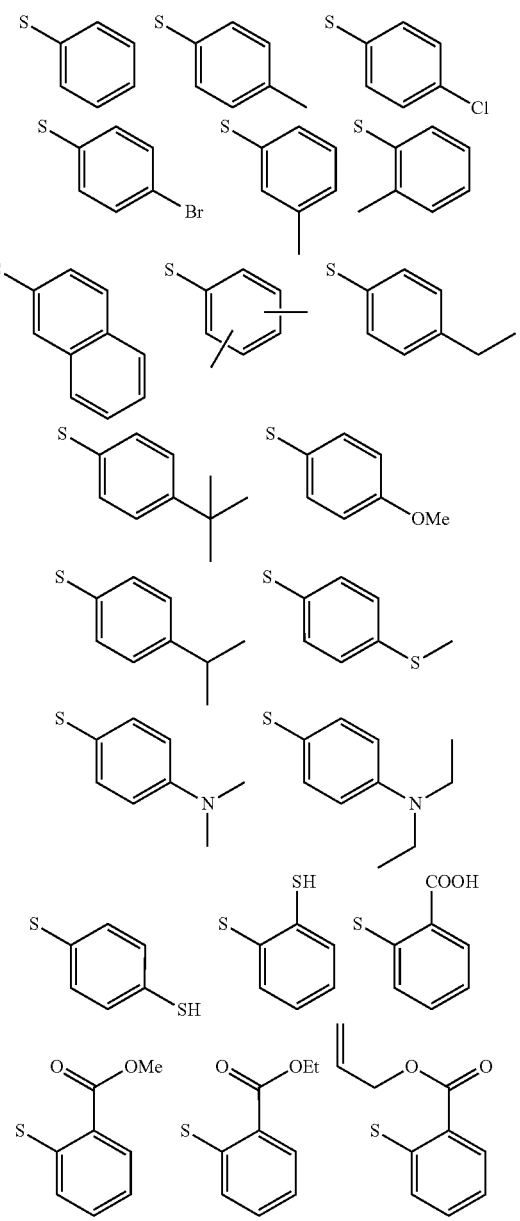

It is preferable that the oxime compound is a compound represented by the following Formula (C-2).

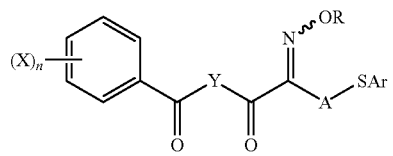

C-2

In Formula (C-2), R and X each independently represent a monovalent substituent, A and Y each independently represent a divalent organic group, Ar represents an aryl group, and n represents an integer of from 0 to 5.

R, A, and Ar in Formula (C-2) have the same definitions as R, A, and Ar in Formula (C-1) described above, respectively, and so are the preferable examples.

Specific examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituent may include the substituents described above. The substituents described above may further be substituted by another substituent.

Among them, X preferably represents an alkyl group, from the viewpoints of solvent solubility and improvement in absorption efficiency in a long wavelength region.

n in Formula (C-2) represents an integer of from 0 to 5, and preferably represents an integer of from 0 to 2.

Examples of the divalent organic group represented by Y above include the following structures. Note that, in the groups described below, "*" denotes a bonding position to a carbon atom adjacent to Y in Formula (C-2) above.

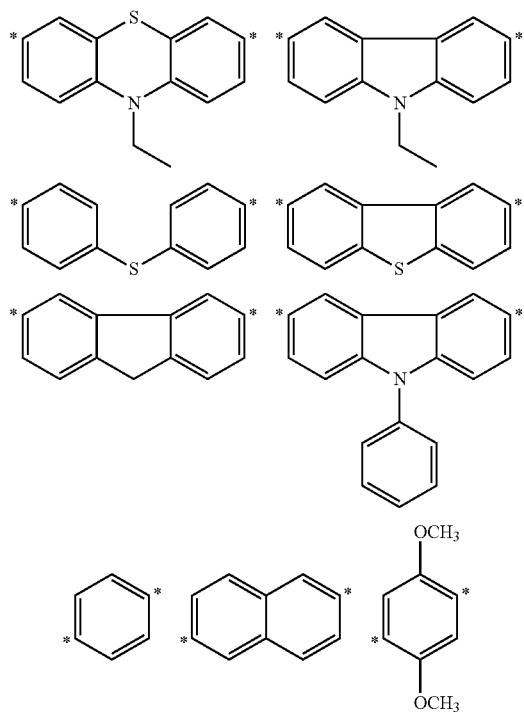

Among the above structures, the structures shown below are preferable, from the viewpoint of enhancing the sensitivity.

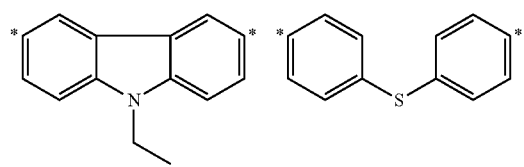

Further, the oxime compound is preferably a compound represented by the following Formula (C-3).

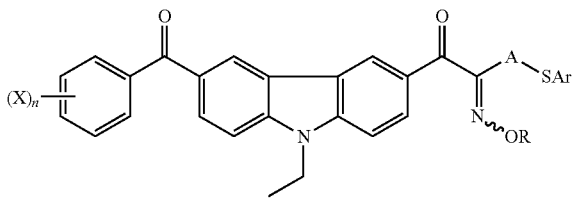

In Formula (C-3), R and X each independently represents a monovalent substituent, A represents a divalent organic group, Ar represents an aryl group, and n represents an integer of from 0 to 5.

R, X, A, Ar, and n in Formula (C-3) have the same definitions as R, X, A, Ar, and n in Formula (C-2) described above, respectively, and so are the preferable examples.

Specific examples (C-4) to (C-13) of the oxime compound which is preferably used are shown below, but it should be construed that the present invention is not limited thereto.

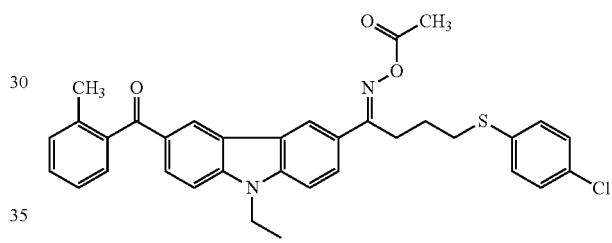

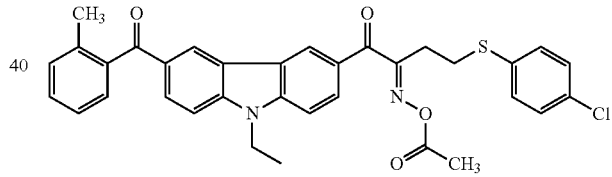

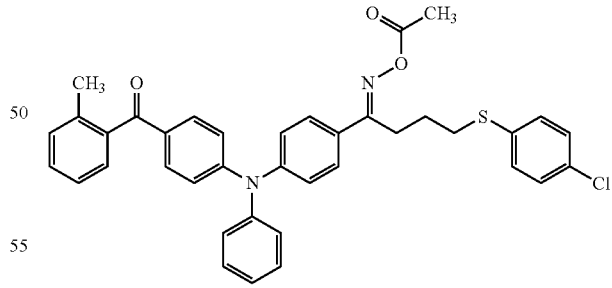

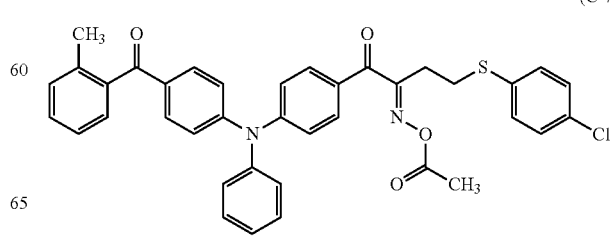

(C-8)
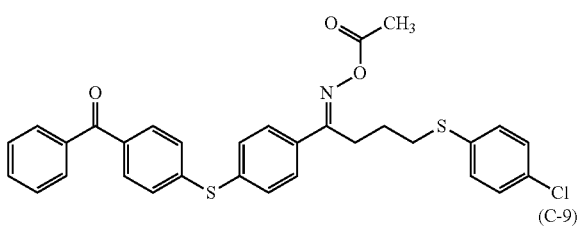

(C-9)
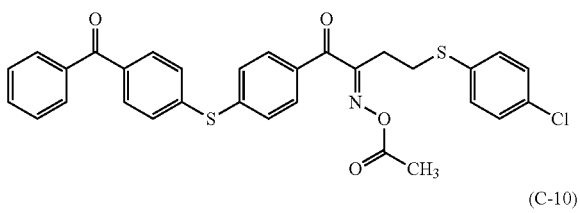

(C-10)
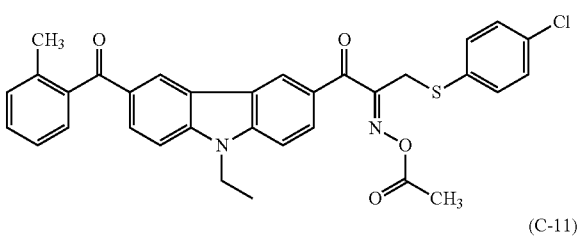

(C-11)
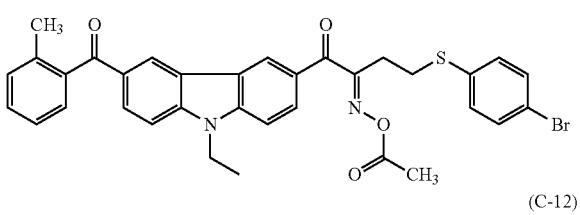

(C-12)
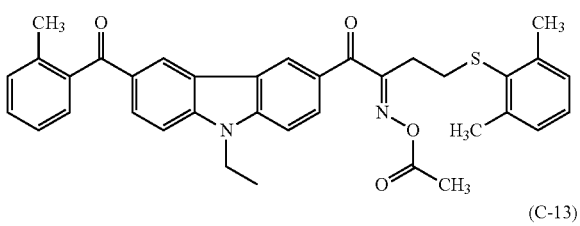

(C-13)
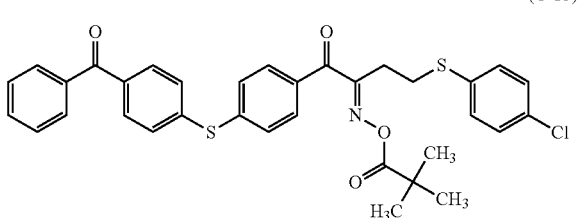

The oxime compound preferably has a maximum absorption wavelength in a wavelength region of from 350 nm to 500 nm, more preferably has an absorption wavelength in a wavelength region of from 360 nm to 480 nm, and particularly preferably has a high absorbance at 365 nm and 455 nm.

From the viewpoint of sensitivity, the oxime compound preferably has a molar absorption coefficient at 365 nm or 405 nm of from 3,000 to 300,000, more preferably from 5,000 to 300,000, and particularly preferably from 10,000 to 200,000.

The molar absorption coefficient of a compound may be measured by a known method. Specifically, it is preferable to measure the molar absorption coefficient using, for example, an ultraviolet-visible spectrometer (trade name: CARRY-5 SPECTROPHOTOMETER, manufactured by Varian), at a concentration of 0.01 g/L using an ethyl acetate solvent.

In the polymerizable composition of the present invention, various kinds of polymerization initiators described above may be used in combination.

The content of the polymerization initiator in the polymerizable composition is preferably from 0.1% by mass to 10.0% by mass, and more preferably from 0.5% by mass to 5.0% by mass, with respect to the total solid content of the composition. When the content of the polymerization initiator is within the above range, polymerization reaction proceeds well and a film having good strength can be formed.

As the polymerization initiator used in the present invention, an oxime compound and a biimidazole compound are most preferable.

<Binder>

It is preferable that the polymerizable composition of the present invention includes at least one binder. The binder is not particularly limited as long as it is soluble in an alkali, while the binder is preferably selected in view of heat resistance, developability, availability, and the like.

The alkali-soluble binder is preferably a linear organic polymer, which is soluble in an organic solvent, and enables development in a weakly alkaline aqueous solution. Examples of such a linear organic polymer include a polymer having a carboxylic acid in a side chain thereof, for example, a methacrylic acid copolymer, an acrylic acid copolymer, an itaconic acid copolymer, a crotonic acid copolymer, a maleic acid copolymer, a partially esterified maleic acid copolymer, or the like, as described in JP-A No. 59-44615, JP-B Nos. 54-34327, 58-12577, and 54-25957, and JP-A Nos. 59-53836 and 59-71048, and also, an acidic cellulose derivative having a carboxylic acid in a side chain thereof is useful. Further, examples of the linear organic polymer include polymers described in paragraphs [0227] to of JP-A No. 2008-292970.

In addition to the above, as the alkali-soluble binder in the present invention, a polymer obtained by adding an acid anhydride to a polymer having a hydroxy group, a polyhydroxystyrene resin, a polysiloxane resin, poly(2-hydroxyethyl(meth)acrylate), polyvinyl pyrrolidone, polyethylene oxide, polyvinyl alcohol, and the like are also useful. Further, the linear organic polymer may be a copolymer obtained through copolymerization using a monomer having hydrophilicity. Examples of the monomer having hydrophilicity include alkoxyalkyl(meth)acrylate, hydroxyalkyl(meth)acrylate, glycerol(meth)acrylate, (meth)acylamide, N-methylolacrylamide, secondary or tertiary alkylacrylamide, dialkyl-amino-alkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or linear propyl(meth)acrylate, branched or linear butyl(meth)acrylate, and phenoxyhydroxypropyl (meth)acrylate. In addition to these monomers, a monomer having a tetrahydrofurfuryl group, a phosphoric acid group, a phosphoric acid ester group, a quaternary ammonium salt group, an ethyleneoxy chain, a propyleneoxy chain, a sulfonic acid group or a group derived from a salt thereof, a morpholinoethyl group, or the like is also useful as the monomer having hydrophilicity.

Furthermore, the alkali-soluble binder may have a polymerizable group in a side chain thereof in order to improve the crosslinking efficiency. For example, a polymer including an allyl group, a (meth)acryl group, an allyloxyalkyl group, or the like in a side chain thereof is also useful. Examples of the above-described polymer including a polymerizable group include KS RESIST-106 (trade name, manufactured by Osaka Organic Chemical Industry Ltd.) and CYCLOMER P SERIES (trade name, manufactured by Daicel Chemical Industries, Ltd.), which are commercially available products. Further, for increasing the strength of a cured film, an alcohol-soluble nylon, polyether of 2,2-bis(4-hydroxyphenyl)-propane and epichlorohydrin, and the like are also useful.

It is also preferable to use a polymer (a) obtained through polymerizing a compound (hereinafter, also referred to as an "ether dimer") represented by the following Formula (E-1) as the alkali-soluble binder.

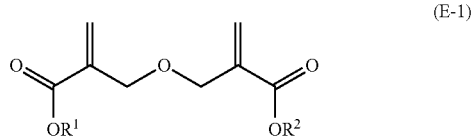
(E-1)

In Formula (E-1), $R^1$ and $R^2$ each independently represent a hydrogen atom or a hydrocarbon group which has from 1 to 25 carbon atoms and may have a substituent.

When the polymerizable composition of the present invention includes the above polymer (a), heat resistance and transparency of a cured coating film that is formed using the composition may be more improved.

In Formula (E-1) above which represents the ether dimer, the hydrocarbon group, which is represented by $R^1$ or $R^2$, has from 1 to 25 carbon atoms, and may have a substituent, is not particularly limited. Examples thereof include a linear or branched alkyl group such as a methyl group, an ethyl group, an n-propyl group, an isopropyl group, an n-butyl group, an isobutyl group, a t-butyl group, a t-amyl group, a stearyl group, a lauryl group, or a 2-ethylhexyl group; an aryl group such as a phenyl group; an alicyclic group such as a cyclohexyl group, a t-butylcyclohexyl group, a dicyclopentadienyl group, a tricyclodecanyl group, an isobornyl group, an adamantyl group, or a 2-methyl-2-adamantyl group; an alkyl group substituted by an alkoxy group such as a 1-methoxyethyl group or a 1-ethoxyethyl group; and an alkyl group substituted by an aryl group such as a benzyl group.

Among them, a group containing a primary or secondary carbon, which hardly eliminates by an acid or heat, such as a methyl group, an ethyl group, a cyclohexyl group, or a benzyl group is particularly preferable from the viewpoint of heat resistance.

It should be noted that $R^1$ and $R^2$ may be the same substituent or may be different from each other.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, bis(2-ethylhexyl)-2,2'-[oxybis(methylene)]bis-2-propenoate, bis(1-methoxyethyl)-2,2'-[oxybis(methylene)]bis-2-propenoate, bis(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, bis(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among them, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. One of these ether dimers may be used alone, or two or more of them may be used.

Further, it is also preferable that the alkali-soluble binder is a polymer having an epoxy group.

An epoxy group may be introduced into the alkali-soluble binder by, for example, polymerizing a monomer having an epoxy group (hereinafter, may be also referred to as a "monomer for introducing an epoxy group") as a monomer component. Examples of the monomer having an epoxy group include glycidyl(meth)acrylate, 3,4-epoxycyclohexyl methyl (meth)acrylate, and o- (or m-, or p-) vinylbenzyl glycidyl ether. One of these monomers for introducing an epoxy group may be used alone, or two or more of them may be used. In the case where the monomer components for obtaining the alkali-soluble binder includes the monomer for introducing an epoxy group, the content ratio thereof is not particularly limited, but the content of the monomer for introducing an epoxy group may be from 5% by mass to 70% by mass, and preferably from 10% by mass to 60% by mass, with respect to the total monomer components.

It is also preferable that the alkali-soluble binder is a polymer having an acid group.

The acid group is not particularly limited. Examples thereof include a carboxy group, a phenolic hydroxy group, and a carboxylic anhydride group. One of these acid groups may exist alone or two or more of them may exist. An acid group may be introduced into the alkali-soluble binder by, for example, polymerization using a monomer having an acid group and/or a monomer to which an acid group can be added after polymerization (hereinafter, may be also referred to as a "monomer for introducing an acid group") as a monomer component.

It should be noted that, in the case of introducing an acid group using a monomer, to which an acid group can be added after polymerization, as a monomer component, a treatment for adding the acid group, for example, a treatment as described below is needed after polymerization.

Examples of the monomer having an acid group include a monomer having a carboxy group such as (meth)acrylic acid or itaconic acid, a monomer having a phenolic hydroxy group such as N-hydroxyphenylmaleimide, and a monomer having a carboxylic anhydride group such as maleic anhydride or itaconic anhydride. Among them, (meth)acrylic acid is particularly preferable.

Examples of the monomer to which an acid group can be added after polymerization include a monomer having a hydroxy group such as 2-hydroxyethyl(meth)acrylate, a monomer having an epoxy group such as glycidyl(meth)acrylate, and a monomer having an isocyanato group such as 2-isocyanatoethyl(meth)acrylate. One of these monomers for introducing an acid group may be used alone, or two or more of them may be used.

In the case of using the monomer to which an acid group can be added after polymerization, an example of the treatment for adding the acid group after polymerization is a treatment of modifying a part of the polar groups in the polymer side chain by a polymer reaction.

Among these various alkali-soluble binders, from the viewpoint of heat resistance, a polyhydroxystyrene resin, a polysiloxane resin, an acrylic resin, an acrylamide resin, and an acryl/acrylamide copolymer resin are preferable, and from the viewpoint of control of developability, an acrylic resin, an acrylamide resin, and an acryl/acrylamide copolymer resin are preferable.

Preferable examples of the acrylic resin include copolymers formed from a monomer selected from the group consisting of benzyl(meth)acrylate, (meth)acrylic acid, hydroxyethyl(meth)acrylate, (meth)acrylamide, and the like, and KS RESIST-106 (trade name, manufactured by Osaka Organic Chemical Industry Ltd.) and CYCLOMER P SERIES (trade name, manufactured by Daicel Chemical Industries, Ltd.), which are commercially available products.

An alkali-soluble phenol resin can also be used as the binder in the present invention. In a case in which the polymerizable composition of the invention is made to be a positive type composition, the alkali-soluble phenol resin can be used preferably. Examples of the alkali-soluble phenol resin include a novolac resin and a vinyl copolymer.

Examples of the novolac resin include ones obtained by condensation of phenols and aldehydes in the presence of an acid catalyst. Examples of the phenols include phenol, cresol, ethylphenol, butylphenol, xylenol, phenylphenol, catechol, resorcinol, pyrogallol, naphthol, and bisphenol A. Examples of the aldehydes include formaldehyde, paraformaldehyde, acetaldehyde, propionaldehyde, and benzaldehyde.

The phenols and the aldehydes may be used alone or in a combination of two or more of them, respectively.

Specific examples of the novolac resin include metacresol, paracresol, and condensation products of a mixture thereof and formalin.

The molecular weight distribution of the novolac resin may be adjusted by means of fractionation or the like. Further, a low molecular weight component having a phenolic hydroxy group such as bisphenol C or bisphenol A may be mixed with the novolac resin.

The binder in the polymerizable composition of the invention is preferably a polymer having a weight average molecular weight (a polystyrene-reduced value measured by GPC) of from 1,000 to $2 \times 10^5$, more preferably a polymer having a weight average molecular weight of from 2,000 to $1 \times 10^5$, and particularly preferably a polymer having a weight average molecular weight of from 5,000 to $5 \times 10^4$.

Further, the acid value of the alkali-soluble binder is preferably from 50 mgKOH/g to 300 mgKOH/g, more preferably from 75 mgKOH/g to 200 mgKOH/g, and particularly preferably from 80 mgKOH/g to 160 mgKOH/g. When the acid value is within this range, development residues may hardly remain at the time of pattern formation, and simultaneously, the uniformity of coating may become better.

The amount of the binder used in the polymerizable composition of the invention is preferably from 10% by mass to 90% by mass, more preferably from 20% by mass to 80% by mass, and particularly preferably from 30% by mass to 70% by mass, with respect to the total solid content of the polymerizable composition of the invention.

<Organic Solvent>

The polymerizable composition of the invention can generally be configured to include an organic solvent. The organic solvent is not particularly limited, fundamentally, as long as the organic solvent satisfies solubility of each component and coatability of the polymerizable composition. Specifically, it is preferable that the organic solvent is selected considering the solubility of the ultraviolet absorbent and binder, coatability, and safety. Further, when preparing the polymerizable composition of the present invention, it is preferable that at least two organic solvents are included.

Preferable examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (examples: methyl oxyacetate, ethyl oxyacetate, and butyl oxyacetate (for example, methyl methoxyacetate, ethyl methoxyacetate, butyl methoxyacetate, methyl ethoxyacetate, ethyl ethoxyacetate, and the like)), 3-oxypropionic acid alkyl esters (examples: methyl 3-oxypropionate, ethyl 3-oxypropionate, and the like (for example, methyl 3-methoxypropionate, ethyl 3-methoxypropionate, methyl 3-ethoxypropionate, ethyl 3-ethoxypropionate, and the like)), 2-oxypropionic acid alkyl esters (examples: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methylpropionate and ethyl 2-oxy-2-methylpropionate (for example, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, and 3-heptanone; and aromatic hydrocarbons such as toluene and xylene.

It is also preferable to mix two or more of these organic solvents, from the viewpoints of solubility of the ultraviolet absorbent and alkali-soluble resin, improvement in coated surface state, and the like. In this case, a mixed solution constituted of two or more selected from the group consisting of methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate, which are described above.

The content of the organic solvent in the polymerizable composition of the invention is preferably adjusted to an amount that gives the total solid concentration of the polymerizable composition of from 5% by mass to 80% by mass, more preferably from 5% by mass to 60% by mass, and particularly preferably from 10% by mass to 50% by mass.

<Other Components>

The polymerizable composition of the present invention may contain, as needs arise, various additives. Examples of the additives include chain transfer agents such as an N,N-dialkylaminobenzoic acid alkyl ester or 2-mercaptobenzothiazole, fluoro surfactants for improving uniformity of coating or nonionic surfactants such as polyoxyethylene alkyl ether, thermal polymerization initiators such as an azo compound or a peroxide compound, thermal polymerization components, polyfunctional thiol or epoxy compounds for the purpose of enhancing the film strength and sensitivity, ultraviolet absorbents such as alkoxybenzophenone, plasticizers such as dioctyl phthalate, developability enhancing agents such as a low molecular weight organic carboxylic acid, fillers, polymer compounds other than the alkali-soluble resin, antioxidants, and aggregation inhibitors.

Further, a thermal curing agent may be added in order to raise the degree of curing of the film by post heating after development. Examples of the thermal curing agent include a thermal polymerization initiator such as an azo compound or a peroxide, a novolac resin, a resol resin, an epoxy compound, and a styrene compound.

(Polymerization Inhibitor)

In the polymerizable composition of the present invention, a small amount of polymerization inhibitor is preferably added to the polymerizable composition in order to prevent unnecessary thermal polymerization of the polymerizable compound during production or storage of the polymerizable composition.

Examples of the polymerization inhibitor which can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and an N-nitrosophenylhydroxyamine cerium (III) salt.

The addition amount of the polymerization inhibitor is preferably from about 0.005% by mass to about 5% by mass, with respect to the total mass of the polymerizable composition.

(Surfactant)

Various surfactants may be added to the polymerizable composition of the invention, from the viewpoint of further improving the coatability. Examples of the surfactants which can be used include an anionic surfactant, a cationic surfactant, a nonionic surfactant, an amphoteric surfactant, a silicone-based surfactant, and a fluoro surfactant.

The nonionic surfactant which may be used in the polymerizable composition of the invention is not particularly limited, and conventionally known nonionic surfactants may be used. Examples thereof include polyoxyethylene alkyl ethers, polyoxyethylene alkyl phenyl ethers, glycerin fatty acid partial esters, sorbitan fatty acid partial esters, pentaerythritol fatty acid partial esters, polyethylene glycol fatty acid esters, polyglycerin fatty acid partial esters, fatty acid diethanolamides, triethanolamine fatty acid esters, trialkylamine oxides, and polyethylene glycol.

Specific examples of the nonionic surfactant include polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (trade names: PLURONIC L10, L31, L61, L62, 10R5, 17R2, and 25R2, and TETRONIC 304, 701, 704, 901, 904, and 150R1, all manufactured by BASF Corporation).

The anionic surfactant which may be used in the polymerizable composition of the invention is not particularly limited, and conventionally known anionic surfactants may be used. Examples thereof include fatty acid salts, abietic acid salts, alkanesulfonic acid salts, alkylbenzenesulfonic acid salts, and alkylnaphthalenesulfonic acid salts.

Specific examples of the anionic surfactant include W004, W005, and W017 (all trade names, manufactured by Yusho Co., Ltd.).

The cationic surfactant which may be used in the polymerizable composition of the invention is not particularly limited, and conventionally known cationic surfactants may be used. Examples thereof include alkylamine salts, quaternary ammonium salts, polyoxyethylene alkylamine salts, and polyethylene polyamine derivatives.

Specific examples of the cationic surfactant include phthalocyanine derivatives (trade name: EFKA-745, manufactured by Morishita Sangyo K.K.), organosiloxane polymer KP341 (trade name, manufactured by Shin-Etsu Chemical Co., Ltd.), (meth)acrylic acid based (co)polymer POYFLOW No. 75, No. 90, and No. 95 (all trade names, manufactured by Kyoeisha Chemical Co., Ltd.), and W001 (trade name, manufactured by Yusho Co., Ltd.).

The amphoteric surfactant which may be used in the polymerizable composition of the invention is not particularly limited, and conventionally known amphoteric surfactants may be used. Examples thereof include carboxybetaines, aminocarboxylic acids, sulfobetaines, aminosulfuric acid esters, and imidazolines.

Examples of the silicone-based surfactant which may be used in the polymerizable composition of the invention include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH3OPA, and TORAY SILICONE SH8400 (all trade names, manufactured by Toray Silicone Co., Ltd.), TSF-4440, TSF-4300, TSF-4445, TSF-4460, and TSF-4452 (all trade names, manufactured by Momentive Performance Materials Inc.), KP341 (trade name, manufactured by Shin-Etsu Silicone Co., Ltd.), and BYK323 and BYK330 (all trade names, manufactured by BYK Chemie Japan K.K.).

The surfactant which is used in the polymerizable composition of the invention is preferably a fluoro surfactant. In the polymerizable composition of the present invention, by containing a fluoro surfactant, liquid properties (particularly, fluidity) is more enhanced when prepared as a coating liquid, and as a result, the uniformity of coating thickness and liquid saving property may be further improved.

Namely, in the case of forming a film by using a coating liquid in which a polymerizable composition including a fluoro surfactant is applied, interfacial tension between the surface to be coated and the coating liquid is lowered, and therefore, wettability to the surface to be coated is improved and coatability to the surface to be coated is enhanced. As a result, even in the case where a thin film having a thickness of about several μm is formed with a small amount of liquid, it is advantageous from the viewpoint that formation of a film having a uniform thickness with little thickness unevenness can be more suitably carried out.

The content of fluorine in the fluoro surfactant is preferably from 3% by mass to 40% by mass, more preferably from 5% by mass to 30% by mass, and particularly preferably from 7% by mass to 25% by mass. When the content of fluorine is within this range, the fluoro surfactant may be effective from the viewpoints of uniformity of coating thickness and liquid saving property, and solubility in the polymerizable composition may also be satisfactory.

Examples of the fluoro surfactant include MEGAFACE F-171, MEGAFACE F-172, MEGAFACE F-173, MEGAFACE F-176, MEGAFACE F-177, MEGAFACE F-141, MEGAFACE F-142, MEGAFACE F-143, MEGAFACE F-144, MEGAFACE R-30, MEGAFACE F-437, MEGAFACE F-475, MEGAFACE F-479, MEGAFACE F-482, MEGAFACE F-554, MEGAFACE F-780, and MEGAFACE F-781 (all trade names, manufactured by DIC Corporation), FLUORAD FC430, FLUORAD FC431, and FLUORAD FC171 (all trade names, manufactured by Sumitomo 3M Ltd.), SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all trade names, manufactured by Asahi Glass Co., Ltd.), and SORSPERSE 20000 (trade name, manufactured by Zeneca Corp.).

A more preferable example of the surfactant is a fluoro surfactant having a perfluoroalkyl group in the molecule.

Examples of such a fluoro surfactant include anionic type fluoro surfactants such as perfluoroalkylcarboxylate, perfluoroalkylsulfonate, and perfluoroalkylphosphate; and fluoro surfactants described in JP-A Nos. 62-170950, 62-226143, and 60-168144.

The surfactants may be used alone, or in a combination of two or more of them.

The content of the surfactant is preferably from 0.001% by mass to 10% by mass, and more preferably from 0.01% by mass to 5% by mass, with respect to the total solid content of the polymerizable composition.

(Adhesion Improving Agent)

To the polymerizable composition of the present invention, an adhesion improving agent which can improve adhesion to a substrate may be added.

It is preferable to use a silane-based coupling agent, a titanate-based coupling agent, or an aluminum-based coupling agent as the adhesion improving agent. Examples of the silane-based coupling agent include γ-methacryloyloxy propyl trimethoxysilane, γ-methacryloyloxy propyl triethoxysilane, γ-acryloyloxy propyl trimethoxysilane, γ-acryloyloxy propyl triethoxysilane, γ-mercaptopropyl trimethoxysilane, γ-aminopropyl triethoxysilane, 3-aminopropyl diethoxymethylsilane, and phenyltrimethoxysilane.

The content of the adhesion improving agent is preferable from 0.1% by mass to 30% by mass, more preferably from 0.5% by mass to 20% by mass, and particularly preferably from 1% by mass to 10% by mass, with respect to the total solid content of the polymerizable composition of the invention, from the viewpoint of not leaving any residues at the unexposed portion when the polymerizable composition is subjected to exposure and development.

The solid content of the polymerizable composition obtained as described above is preferably in a range of from 10% by mass to 45% by mass, more preferably in a range of from 15% by mass to 40% by mass, and even more preferably in a range of from 25% by mass to 40% by mass. When the solid content is within this range, in the case of forming a colored layer on a substrate, a colored layer having a uniform thickness can be obtained even if the layer is thin.

[Color Filter and Production Method Thereof]

Next, the color filter of the present invention is explained.

The color filter of the present invention has, on a support, a colored pattern which is formed using the polymerizable composition of the present invention.

In the following, the color filter of the present invention is described in detail by reference to a production method thereof.

The color filter of the present invention may be produced by a production method including a process (a colored layer formation process) of forming a colored layer containing the polymerizable composition of the present invention by coating the polymerizable composition on a support, a process (an exposure process) of exposing the colored layer through a mask, and a process (a development process) of forming a colored pattern by performing development of the colored layer after exposure.

<Colored Layer Formation Process>

In the colored layer formation process, the polymerizable composition of the present invention is coated on a support, thereby forming a colored layer formed from the polymerizable composition of the present invention.

Examples of the support which can be used in this process include a photoelectric transducer substrate, which is used in a solid-state imaging device or the like, for example, a silicone substrate, and a complementary metal oxide semiconductor (CMOS). There are cases in which these substrates are provided with black stripes for isolating each pixel.

Further, an undercoat layer may be provided on these supports, as necessary, in order to improve adhesion to the upper layer, to prevent diffusion of materials, and to flatten the substrate surface.

As a method for coating the polymerizable composition of the invention on the support, various coating methods such as slit coating, an inkjet method, spin coating, cast coating, roll coating, or a screen printing method can be applied.

The film thickness just after coating of the polymerizable composition is preferably from 0.1 μm to 10 μm, more preferably from 0.2 μm to 5 μm, and even more preferably from 0.2 μm to 3 μm, from the viewpoints of uniformity of film thickness of the coated layer and easiness of drying of the solvent for coating.

The colored layer (polymerizable composition layer) coated on a substrate can be dried (pre-baked) at a temperature of from 50° C. to 160° C. for 10 seconds to 500 seconds using a hot plate, an oven, or the like.

The thickness of the coated film of the polymerizable composition after drying (hereinafter, may be referred to as a "dry film thickness" in some cases) is preferably 0.05 μm or more but less than 5.0 μm, more preferably from 0.1 μm to 4.5 μm, and particularly preferably from 0.2 μm to 3.0 μm, from the viewpoint of maintaining color density and from the viewpoint of reducing problems in that the light from an oblique direction does not reach the light-receiving unit or the difference in light-gathering rate between the end and the center of the device is remarkable.

<Exposure Process>

In the exposure process, the colored layer (polymerizable composition layer) formed in the above colored layer formation process is exposed through a mask having a predetermined mask pattern.

In the exposure in this process, the pattern exposure of the coated film can be carried out by exposing the coated film through a predetermined mask pattern to cure only the coated film portion that is irradiated with light. As the radiation which can be used when carrying out exposure, particularly, ultraviolet rays such as g-line, h-line, or i-line are preferably used. The irradiation amount is preferably from 30 mJ/cm$^2$ to 1500 mJ/cm$^2$, more preferably from 50 mJ/cm$^2$ to 1,000 mJ/cm$^2$, and most preferably from 80 mJ/cm$^2$ to 600 mJ/cm$^2$.

<Development Process>

In the development process, an alkali development treatment (development process) is carried out. In the development process, a portion that has not been irradiated with light in the exposure process is dissolved in an alkaline aqueous solution (developing solution), whereby only the photo-cured portions remain to form a film in a patterned film. The development system may be any of a dipping system, a shower system, a spray system, a paddle system, or the like, which may be used in combination with a swing system, a spinning system, an ultrasonic system, or the like. Further, paddle development may be also used. Before contact with the developing solution, the surface of the coated film to be developed may be moistened with water or the like in advance, thereby enabling prevention of development unevenness.

The development temperature is usually from 15° C. to 40° C., and the development time is preferably from 20 seconds to 90 seconds.

Examples of alkali agents used in the developing solution include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; and inorganic compounds such as sodium hydroxide, potassium hydroxide, sodium hydrogencarbonate, and potassium hydrogencarbonate. An alkaline aqueous solution, which is prepared by diluting the above alkali agent with pure water so as to have a concentration of from 0.001% by mass to 10% by mass and preferably from 0.01% by mass to 1% by mass, is preferably used as a developing solution.

Particularly, among the above developing solutions, organic alkali developing solutions are preferable which do not cause damage to the underlying circuit and the like.

Subsequently, an excess of the developing solution is removed with washing using pure water (rinsing), and then drying is carried out.

In the production method according to the invention, after the above-described colored layer formation process, exposure process, and development process are carried out, as needs arise, a curing process of curing the formed colored pattern by post-heating (post bake) or post-exposure may be carried out. The post bake treatment is a heating treatment after development to ensure complete curing, and a thermal curing treatment is usually carried out at a temperature of from 100° C. to 270° C. In the case of using a light in the curing process, curing may be carried out by using g-line, h-line, i-line, an excimer laser such as KrF or ArF, electron beams, X-rays, or the like, while it is preferable to carry out curing using an existing high pressure mercury lamp at a low temperature of about 15° C. to about 50° C. The irradiation time is from 10 seconds to 180 seconds, and preferably from 30 seconds to 60 seconds. In a case in which post-exposure and post-heating are used in combination, it is preferable to carried out the post-exposure before the post-heating.

The colored layer formation process, exposure process, and development process (and further, the curing process, as necessary) explained above are repeated by the desired number of hues (for example, 3 colors or 4 colors) to prepare a color filter having desired hues.

Application of the polymerizable composition of the present invention has been described mainly by reference to application to pixels of a color filter, but the polymerizable composition can also be applied to a black matrix provided between the pixels of a color filter. The black matrix can be formed by performing pattern exposure, alkali development, and then, post bake to accelerate curing of the film, in a manner substantially similar to the above method of preparing pixels, except that a black pigment such as carbon black or titanium black is added to the polymerizable composition of the invention as a coloring agent.

Since the color filter of the present invention is manufactured using the polymerizable composition of the present invention, which has excellent exposure sensitivity, the cured composition in the exposed portion has excellent adhesion to the substrate and exhibits excellent development resistance, adhesion between the colored pattern formed and the support substrate is high, and a high-resolution pattern which gives a desired cross-sectional form may be obtained.

Further, the solid-state imaging device of the present invention is equipped with the above color filter of the present invention.

Therefore, specifically, the color filter of the present invention can preferably be used in solid-state imaging devices such as liquid crystal displays or CCDs (charge coupled devices). In particular, the color filter of the present invention is preferably applied to high-resolution CCD devices such as those having a high resolution exceeding one million pixels, CMOSs (complementary metal oxide semiconductors), or the like. The color filter of the invention may be used, for example, as a color filter which is disposed between the light receiving units of pixels included in a CCD device and a microlens to gather light.

EXAMPLES

The present invention is further described below in detail with reference to the examples, but it should be construed that the invention is in no way limited to these examples as long as not departing from the scope of the present invention. Note that, "part" and "%" are based on mass, unless otherwise noted.

<Synthesis of Dispersion Resin 1>

600.0 g of ε-caprolactone and 22.8 g of 2-ethyl-1-hexanol were introduced in a 500 mL three necked flask, and then, while blowing nitrogen gas into the flask, the mixture was stirred and dissolved. Thereafter, 0.1 g of monobutyl tin oxide was added thereto and the mixture was heated to a temperature of 100° C. 8 hours later, it was verified that the raw materials were disappeared by the use of gas chromatography, and then, the resulting mixture was cooled to 80° C. 0.1 g of 2,6-di-t-butyl-4-methylphenol was added thereto, and then, 27.2 g of 2-methacryloyloxy ethyl isocyanate was added. 5 hours later, it was verified that the raw materials were disappeared by the use of $^1$H-NMR. Thereafter, the resulting substance was cooled to room temperature to obtain 200 g of solid-state precursor M1 (having the structure shown below). It was verified that the resulting substance was M1 by the use of $^1$H-NMR, IR, and mass spectroscopy.

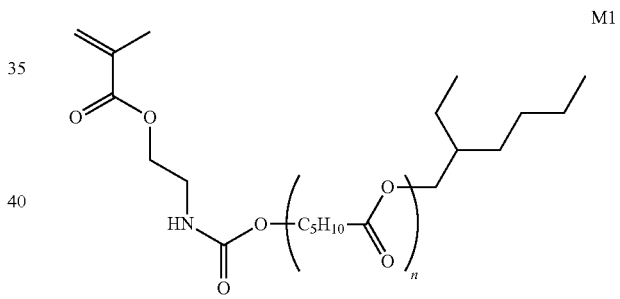

M1

30.0 g of precursor M1, 70.0 g of 2-methacryloyloxy ethyl phthalate (trade name: NK ESTER CB-1, manufactured by Shin-Nakamura Chemical Co., Ltd.), 2.3 g of dodecyl mercaptan, and 233.3 g of propylene glycol monomethyl ether acetate (hereinafter, referred to as "PGMEA") were introduced into a three necked flask which had been substituted with nitrogen, and the mixture was stirred using an agitator (trade name: THREE-ONE MOTOR AGITATOR, manufactured by SHINTO Scientific Co., Ltd.), and heated to reach a temperature of 75° C., while flowing nitrogen in the flask. 0.2 g of dimethyl 2,2-azobis(2-methylpropionate) (trade name: V-601, manufactured by Wako Pure Chemical Industries, Ltd.) was added thereto, and the resulting mixture was heated and stirred at 75° C. for two hours. Two hours later, 0.2 g of V-601 was further added thereto, and the mixture thus obtained was heated and stirred for 3 hours. Thereby, a 30% solution of dispersant 1 (having the structure shown below) was obtained.

<Synthesis of Dispersion Resins 2 to 5>

The following dispersant 2 to dispersant 5 were synthesized according to a synthetic method substantially similar to the synthetic method of dispersant 1.

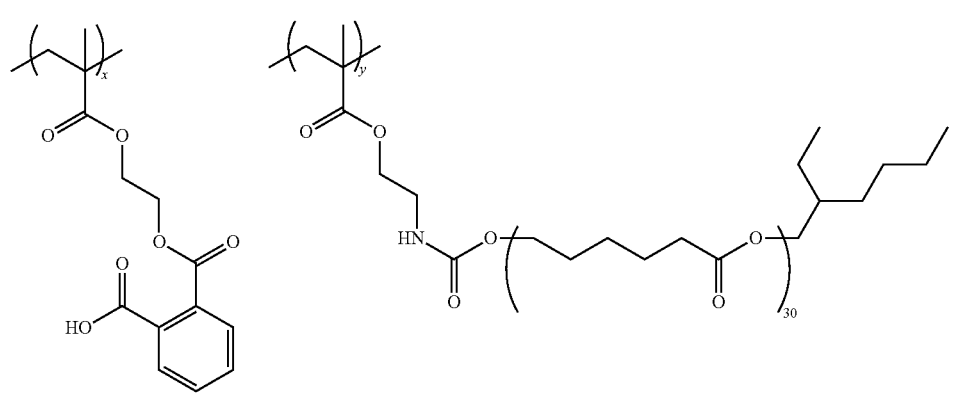
Dispersant 1
(x: 65, y: 35; Mw = 30,000)
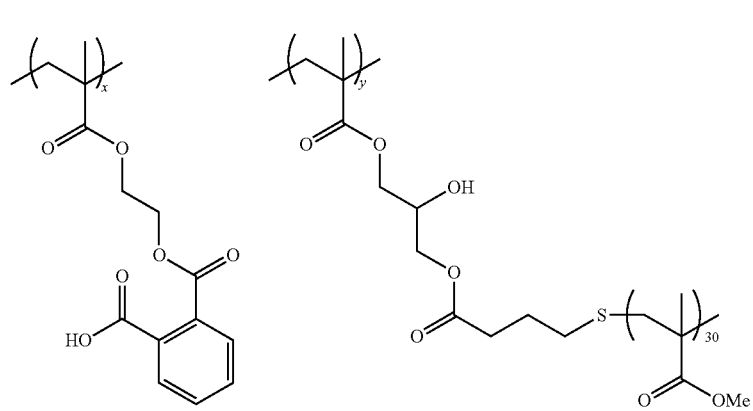
Dispersant 2
(x: 50, y: 50; Mw = 10,000)
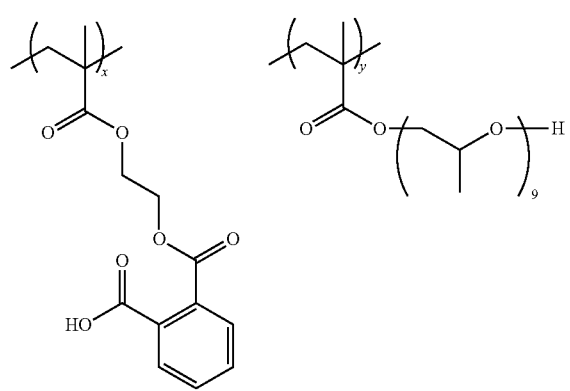
Dispersant 3
(x: 45, y: 55; Mw = 20,000)

Dispersant 4

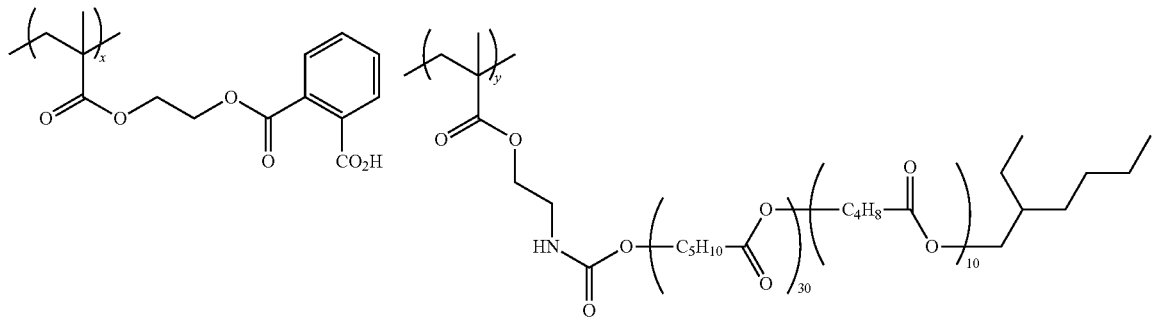

(x: 50, y: 50; Mw = 25,000)

Dispersant 5

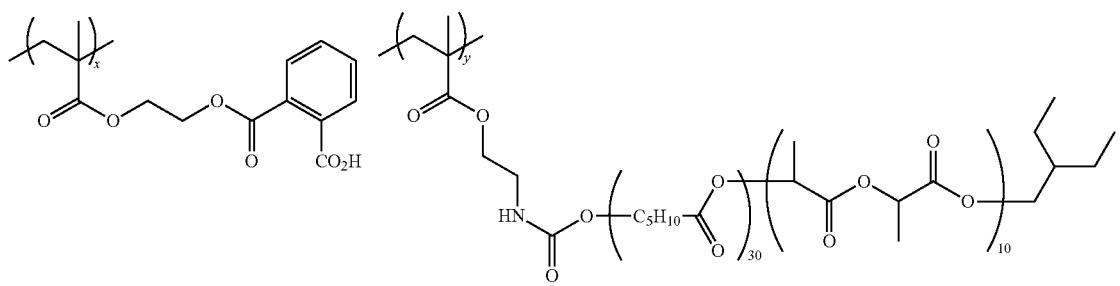

(x: 75, y: 25; Mw = 35,000)

<Preparation of Dispersion Compositions 1 to 4 of Titanium Black>

The composition A described below including one of the dispersants 1 to 4 was stirred for 3 hours, under the following conditions, using a homogenizer under the condition of 3,000 rpm. The mixed solution thus obtained was subjected to a dispersion treatment using ULTRA APEX MILL UAM 015 (trade name), manufactured by Kotobuki Industries Co., Ltd. under the following conditions, and during the dispersion, the dispersant was further added when the condition reached the condition described below.

(Composition A)

| | |
|---|---|
| Titanium black (trade name: 13M-T, manufactured by Mitsubishi Materials Corporation) | 25 parts |
| One of the dispersants 1 to 4 | 5 parts based on solid content |
| Solvent (PGMEA) | an amount that gives the solid content of the dispersion composition of 36.0% |

| | |
|---|---|
| Bead diameter | 0.05 mm |
| Beads filling factor | 75% |
| Peripheral speed of mill | 12 m/s |
| Amount of charged liquid | 800 g |
| Circulation flow rate | 13 kg/h |
| Temperature of treatment liquid | from 25° C. to 30° C. |

(Addition of Dispersant)

While carrying out the dispersion treatment under the above conditions, a particle size distribution of the dispersion composition was measured, and when the rate of change in particle diameter per one pass became −10 nm or more, a PGMEA solution (solid content of 30%) of the dispersant 1 to 4 was added in an amount the same as the amount of the dispersant added at the beginning of dispersion, to obtain a dispersion composition having a solid content of 35.0% (content of titanium black of 25% by mass and solid content of the dispersant of 10% by mass). After the addition of the dispersant, the dispersion treatment was further carried out for 10 passes. Thereby, dispersion compositions 1 to 4 of titanium black were obtained.

<Preparation of Dispersion Compositions 5 and 6 of Titanium Black>

The composition B described below including the dispersant 5 or DISPERBYK 111 (trade name, manufactured by BYK Chemie Japan K.K.) was stirred for 3 hours, under the following conditions, using a homogenizer under the condition of 3,000 rpm. The mixed solution thus obtained was subjected to a dispersion treatment using ULTRA APEX MILL UAM 015 (trade name), manufactured by Kotobuki Industries Co., Ltd. under the following conditions.

(Composition B)

| | |
|---|---|
| Titanium black (trade name: 13M-T, manufactured by Mitsubishi Materials Corporation) | 25 parts |
| Dispersant (dispersant 5 or DISPERBYK 111 (trade name)) | 10 parts based on solid content |
| Solvent (PGMEA)) | an amount that gives the solid content of the dispersion composition of 35.0% |

(Dispersion Conditions)

| Bead diameter | 0.05 mm |
|---|---|
| Beads filling factor | 75% |
| Peripheral speed of mill | 12 m/s |
| Amount of charged liquid | 800 g |
| Circulation flow rate | 13 kg/h |
| Temperature of treatment liquid | from 25° C. to 30° C. |

(Addition of Dispersant)

While carrying out the dispersion treatment under the above conditions, a particle size distribution of the dispersion liquid was measured, and when the rate of change in particle diameter per one pass became −10 nm or more, a 35% PGMEA solution of the dispersant 5 or DISPERBYK 111 (trade name) was added in an amount of 5 parts based on the solid content. After the addition of the dispersant, the dispersion treatment was further carried out for 10 passes.

(Preparation of Dispersion Composition 7 of Carbon Black)

The composition C described below was subjected to a high viscosity dispersion treatment using a twin roller, to obtain a dispersion composition. In this process, the viscosity of the dispersion composition was 70,000 mPa·s.

Thereafter, a mixture of the composition D described below was added to the dispersion composition thus obtained, and stirring was carried out for 3 hours using a homogenizer under the condition of 3,000 rpm. Then, the mixed solution thus obtained was subjected to a fine dispersion treatment for 4 hours, using a disperser (trade name: DISPERMAT, manufactured by GETZMANN GmbH) employing 0.3 mm zirconia beads. In this way, dispersion composition 7 of carbon black was prepared. In this process, the viscosity of the mixed solution was 37 mPa·s.

(Composition C)

| Carbon black (mean primary particle diameter of 15 nm) | 23 parts |
|---|---|
| 45% PGMEA solution of benzyl methacrylate/methacrylic acid (molar ratio = 67/33) copolymer (Mw: 28,000) | 22 parts |
| Dispersant (trade name: SORSPERSE 5000, manufactured by Zeneca Corp.) | 1.2 parts |

(Composition D)

| 45% PGMEA solution of a benzyl methacrylate/methacrylic acid (molar ratio = 67/33) copolymer (Mw: 28,000) | 22 parts |
|---|---|
| Solvent (PGMEA) | 200 parts |

Examples 1 to 6 and Comparative Examples 1 and 2

<Black Polymerizable Composition>

The components of the composition E described below were mixed using an agitator to prepare black polymerizable compositions of Examples 1 to 6 and Comparative examples 1 and 2 as shown in Table 1.

(Composition E)

| Polymerizable compound (the polymerizable compound described in Table 1) | 4 parts |
|---|---|
| Resin (the resin described in Table 1) | 4 parts |
| Dispersion composition (the dispersion composition described in Table 1) | 24 parts |
| Solvent (PGMEA) | 4 parts |
| Solvent (cyclohexanone) | 6 parts |
| Solvent (butyl acetate) | 8 parts |
| Polymerization initiator (the compound described in Table 1) | 0.7 parts |
| Specific polymer (the specific polymer described in Table 1) | 0.5 parts |
| Others (the compound described in Table 1) | an amount described in Table 1 |

TABLE 1

| | Dispersion Composition | Polymerization Initiator | Polymerizable Compound | Resin | Specific Polymer | Others |
|---|---|---|---|---|---|---|
| Example 1 | 1 | I-2 | MM-1 | B-1 | K-8 | — |
| Example 2 | 1 | Mixture of I-1 and I-5 (mass ratio 1/1) | MM-1 | B-2 | K-1 | SH-1 0.15 parts |
| Example 3 | 3 | I-3 | MM-3 | B-3 | K-16 | — |
| Example 4 | 4 | I-4 | MM-1 | B-2 | K-6 | — |
| Example 5 | 2 | I-2 | MM-1 | B-1 | K-4 | — |
| Example 6 | 5 | I-2 | MM-1 | B-1 | K-9 | — |
| Comparative Example 1 | 1 | I-2 | MM-1 | B-1 | — | H-1 0.5 parts |
| Comparative Example 2 | 1 | I-2 | MM-1 | B-1 | — | H-2 0.5 parts |

The compounds used in Table 1 and the compounds used in Table 3 below are described below. K-1, K-4, K-6, K-7, K-8, K-9, K-15, and K-16 are the exemplary compounds of the specific polymer described above. H-1 and H-2 are compounds not having the structure of the specific polymer according to the present invention, which were used instead of the specific polymer.

The structures of the polymerization initiator I-1, I-2, I-3, and I-4, the structures of H-1 and H-2, and the structures of SH-1 and SH-2, which are used in Table 1 and Table 3 are shown below.

Polymerization Initiator I-1

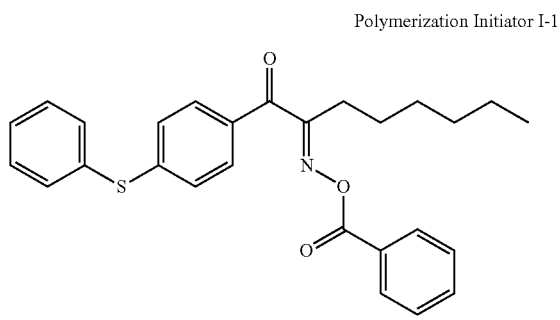

(IRGACURE OXE01 (trade name, manufactured by Ciba Specialty Chemicals Corporation))

Polymerization Initiator I-2

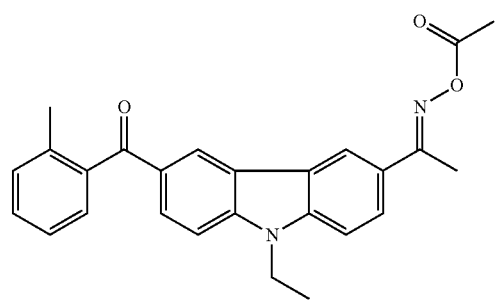

(IRGACURE OXE02 (trade name, manufactured by Ciba Specialty Chemicals Corporation))

Polymerization Initiator I-3

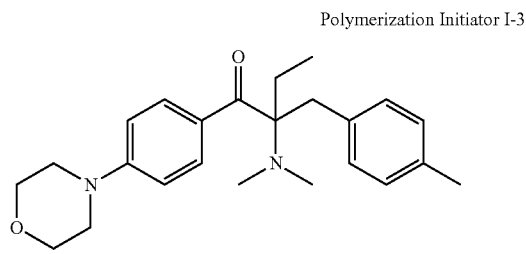

(IRGACURE 379 (trade name, manufactured by Ciba Specialty Chemicals Corporation))

Polymerization Initiator I-4

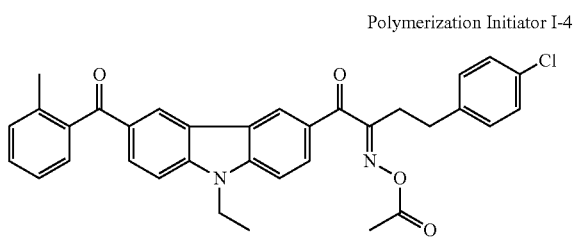

-continued (H-1)

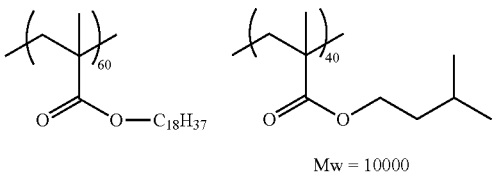

Mw = 10000

(H-2)

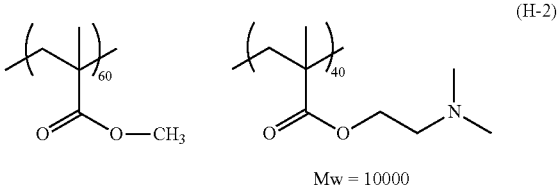

Mw = 10000

SH-1

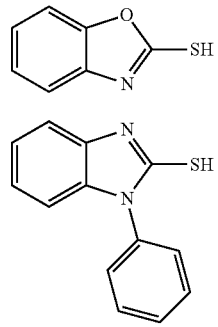

SH-2

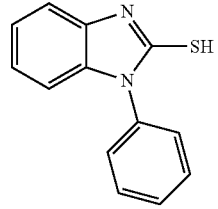

Polymerization initiator 1-5 used in Table 1 and Table 3 is a mixture of 2,2'-bis(o-chlorophenyl)-4,5,4',5'-tetraphenyl-1,2'-biimidazole and 4,4'-bis(dimethylamino)benzophenone (mixing ratio of 5/2 by mass).

The polymerizable compounds are as follows.

MM-1: Dipentaerythritol hexaacrylate (trade name: DPHA, manufactured by Nippon Kayaku Co., Ltd.)

MM-3: Pentaerythritol triacrylate (trade name: NK ESTER A-TMPT, manufactured by Sin-Nakamura Chemical Co., Ltd.)

MM-5: 2,2-Bis[4-(acryloxy•diethoxy) phenyl]propane (trade name: NK ESTER A-BPE-4, manufactured by Sin-Nakamura Chemical Co., Ltd.)

MM-6: Tris(2-hydroxyethyl)isocyanurate triacrylate (trade name: SR-368, manufactured by Nippon Kayaku Co., Ltd.)

MM-7: Pentaerythritol triacrylate hexamethylene diisocyanate urethane prepolymer (trade name: UA-306H, manufactured by Kyoeisha Chemical Co., Ltd.)

The resins are as follows.

B-1: Benzyl methacrylate/methacrylic acid (mass ratio=70/30) copolymer, Mw=10,000

B-2: Resin having a polymerizable side chain in which 20% of the methacrylic units of a styrene/methacrylic acid (mass ratio=50/50) copolymer is modified by glycidyl methacrylate, Mw=30,000

B-3: Methyl methacrylate/hydroxyethyl methacrylate/β-methacryloyloxy ethyl hydrogensuccinate (mass ratio=50/20/30) copolymer, Mw=20,000

<Preparation of Color Filter for Light-Shielding Film for Use in Solid-State Imaging Device>

The components of the composition F described below were mixed and dissolved to prepare a resist liquid for forming an undercoat layer.

(Composition F)

| | |
|---|---|
| Solvent: PGMEA | 19.20 parts |
| Solvent: Ethyl lactate | 36.67 parts |
| Binder polymer: 40% PGMEA solution of a benzyl methacrylate/methacrylic acid/2-hydroxyethyl methacrylate (molar ratio = 60/22/18) copolymer | 30.51 parts |
| Polymerizable compound: dipentaerythritol hexaacrylate | 12.20 parts |
| Polymerization inhibitor: p-Methoxyphenol | 0.0061 parts |
| Fluoro surfactant (trade name: MEGAFACE F-475, manufactured by DIC Corporation) | 0.83 parts |
| Polymerization initiator: TAZ-107 (trade name, manufactured by Midori Kagaku Co., Ltd.; trihalomethyl triazine based photopolymerization initiator) | 0.586 parts |

A 6-inch silicon wafer was subjected to a heating treatment in an oven under the condition of 200° C. for 30 minutes. Then, the resist liquid described above was coated on the silicon wafer to give a dry film thickness of 2 μm, and further dried by heating in an oven at 220° C. for one hour to form an undercoat layer. In this way, a silicon wafer substrate provided with an undercoat layer was obtained.

<Evaluation of Sensitivity: Difference in Image Width>

The black polymerizable compositions of Examples 1 to 6 and Comparative examples 1 and 2 obtained as described above were each coated on the silicon wafer obtained as described above by a spin coating method, and then heated on a hot plate at 120° C. for two minutes. Thereby, a colored layer having a film thickness of 2.5 μm was obtained.

Subsequently, the obtained colored layer was subjected to exposure through a photomask having a 3 mm square pattern, using an i-line stepper, at an exposure amount of 300 mJ/cm².

After exposure, the colored layer was subjected to paddle development using a 0.3% by mass aqueous solution of tetramethylammonium hydroxide at 25° C. for 40 seconds. Thereafter, rinsing was carried out by a spin shower, and further, water washing with pure water was carried out, thereby obtaining a light-shielding film pattern. A cross section of the pattern was photographed using an SEM (scanning electron microscope), and the difference in image width between the outermost surface and the vicinity of the substrate (which corresponds to the depth of the colored layer) in the colored layer was measured. When the difference in image width is 3 μm or less, it is good. Results are shown in Table 2.

TABLE 2

| | Image Difference (μm) |
|---|---|
| Example 1 | 1.7 |
| Example 2 | 1 or less |
| Example 3 | 1.9 |
| Example 4 | 1.4 |
| Example 5 | 1.9 |
| Example 6 | 1.5 |
| Comparative Example 1 | 3.8 |
| Comparative Example 2 | 3.2 |

As is clear from Table 2, in each of Examples 1 to 6, in which the specific polymer was used, the difference in image width between the outermost surface and the vicinity of the substrate (which corresponds to the depth of the colored layer) in the colored layer was 3 μm or less, and Examples 1 to 6 exhibited a good rectangular pattern. On the contrary, in Comparative examples 1 and 2, in which a polymer not having the structure of the specific polymer was used instead of using the specific polymer according to the present invention, the difference in image width was great, and a good pattern was not obtained.

Examples 7 to 10, and Comparative Example 3

<Black Polymerizable Composition>

The components of the composition G described below were mixed using an agitator to prepare black polymerizable compositions of Examples 7 to 10 and Comparative example 3.

(Composition G) (Having High Light-Shielding Properties)

| | |
|---|---|
| Polymerizable compound (the polymerizable compound described in Table 3) | 4 parts |
| Resin (the resin described in Table 3) | 4 parts |
| Dispersion composition (the dispersion composition described in Table 3) | 24 parts |
| Solvent (cyclohexanone) | 10 parts |
| Solvent (butyl acetate) | 8 parts |
| Polymerization initiator (the compound described in Table 3) | 0.75 parts |
| Specific polymer (the specific polymer described in Table 3) | 0.55 parts |
| Adhesion improving agent (S) (having the structure shown below) | 0.1 parts |
| Others (the compound described in Table 3) | an amount described in Table 3 |

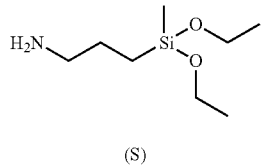

(S)

<Preparation of Color Filter for Light-Shielding Film for Use in Solid-State Imaging Device>

The black polymerizable compositions of Examples 7 to 10 and Comparative example 3 obtained as described above were each coated on the silicon wafer having no undercoat layer by a spin coating method, and then heated on a hot plate at 120° C. for two minutes to obtain a colored layer.

Subsequently, the obtained colored layer was subjected to exposure through a photomask having a 2.5 μm line pattern, using an i-line stepper, at an exposure amount of 400 mJ/cm². Thereafter, paddle development was carried out using a 0.3% aqueous solution of tetramethylammonium hydroxide at 25° C. for 40 seconds. Thereafter, rinsing was carried out by a spin shower, and further, water washing with pure water was carried out, thereby obtaining a light-shielding film pattern. A cross section of the pattern was photographed using an SEM (scanning electron microscope), and the difference in image width between the outermost surface and the vicinity of the substrate (which corresponds to the depth of the colored layer) in the colored layer was measured. When the difference in image width is 0.2 μm or less, it is good. Results are shown in Table 3.

TABLE 3

| | Dispersion Composition | Polymerization Initiator | Polymerizable Compound | Resin | Specific Polymer | Others | Image Difference (μm) |
|---|---|---|---|---|---|---|---|
| Example 7 | 1 | I-4 | MM-1 | B-1 | K-7 | — | 0.11 |
| Example 8 | 2 | I-5 | MM-6 | B-1 | K-15 | SH-2 0.12 parts | 0.12 |
| Example 9 | 3 | I-3 | MM-7 | B-3 | K-4 | — | 0.16 |
| Example 10 | 6 | I-2 | MM-5 | B-3 | K-9 | — | 0.17 |
| Comparative Example 3 | 5 | I-2 | MM-1 | B-2 | — | H-2 0.55 parts | 0.25 |

Also in the formation of a pattern having high light-shielding properties due to high density of the light-shielding material, in each of Examples 7 to 10, in which the specific polymer was used, the difference in image width between the outermost surface and the vicinity of the substrate (which corresponds to the depth of the colored layer) in the colored layer was 0.2 μm or less, and Examples 7 to 10 exhibited a good rectangular pattern. On the contrary, in Comparative example 3, in which a polymer not having the structure of the specific polymer was used instead of using the specific polymer according to the present invention, the difference in image width was great, and a good pattern was not obtained.

<Preparation of Solid-State Imaging Device>

—Preparation of Chromatic Colored Polymerizable Composition—

Colored polymerizable composition R-1 for red (R), colored polymerizable composition G-1 for green (G), and colored polymerizable composition B-1 for blue (B) were each prepared in a manner substantially similar to that in the preparation of the dispersion liquid 1 used in Example 1, except that titanium black, that is a black pigment, was replaced with the following chromatic pigment.

Chromatic pigments for forming R, G, or B colored pixels

Pigment for red (R)

C.I. Pigment Red 254

Pigment for green (G)

A 30/70 [mass ratio] mixture of C.I. Pigment Green 36 and C.I. Pigment Yellow 219

Pigment for blue (B)

A 30/70 [mass ratio] mixture of C.I. Pigment Blue 15:6 and C.I. Pigment Violet 23

—Preparation of Color Filter for Solid-State Imaging Device—

A black matrix was formed using the black photosensitive composition prepared in Example 1, and on the black matrix, a red (R) colored pattern having a size of 1.6 μm×1.6 μm was formed using the colored polymerizable composition R-1 for red (R) in a manner substantially similar to that described in Example 1. Further, in a manner substantially similar to that described above, a green (G) colored pattern having a size of 1.6 μm×1.6 μm and a blue (B) colored pattern having a size of 1.6 μm×1.6 μm were formed in this order, using the colored polymerizable composition G-1 for green (G) and the colored polymerizable composition B-1 for blue (B), respectively. In this way, a color filter for a solid-state imaging device was prepared.

—Evaluation—

When the color filter for full color was disposed in a solid-state imaging device, it was verified that the solid-state imaging device had a light-shielding color filter with high light-shielding properties, and exhibited high resolution, little noise, and excellent color separation properties.

The invention claimed is:

1. A polymerizable composition for a color filter, comprising (A) a polymerizable compound, (B) a polymerization initiator, (C) a coloring agent, and (D) a polymer comprising at least (i) a group having polymerization inhibiting ability selected from the group consisting of a phenol group and an N-oxide group and (ii) a group having surface localizability.

2. The polymerizable composition for a color filter according to claim 1, wherein the group having surface localizability is a functional group selected from the group consisting of an alkyl group having from 6 to 30 carbon atoms, a fluoroalkyl group having from 3 to 25 carbon atoms, and a siloxane group.

3. The polymerizable composition for a color filter according to claim 2, wherein the group having surface localizability is a functional group selected from the group consisting of a fluoroalkyl group having from 3 to 25 carbon atoms and a siloxane group.

4. The polymerizable composition for a color filter according to claim 3, wherein the group having surface localizability is a fluoroalkyl group having from 3 to 25 carbon atoms.

5. The polymerizable composition for a color filter according to claim 1, wherein the coloring agent (C) is titanium black.

6. The polymerizable composition for a color filter according to claim 1, wherein the solid content of the polymerizable composition for a color filter is in a range of from 25% by mass to 40% by mass.

7. A color filter comprising, on a support, a colored pattern that is formed from the polymerizable composition for a color filter according to claim 1.

8. A solid-state imaging device equipped with the color filter according to claim 7.

9. A method for producing a color filter, comprising:
coating the polymerizable composition according to claim 1 on a support to form a colored layer containing the polymerizable composition;
exposing the colored layer through a mask; and
developing the colored layer after exposure to form a colored pattern.

10. The polymerizable composition for a color filter according to claim 1, wherein the polymerization initiator (B) comprises an oxime compound.

11. The polymerizable composition for a color filter according to claim 1, wherein the group having polymerization inhibiting ability is an N-oxide group.

12. The polymerizable composition for a color filter according to claim 1, further comprising a dispersion resin, wherein
the coloring agent (C) comprises an organic pigment or an inorganic pigment; and
the dispersion resin comprises a graft copolymer having a number of atoms other than hydrogen atoms of from 50 to 2,000 atoms per one graft chain.

13. The polymerizable composition for a color filter according to claim 12, wherein the graft copolymer comprises a carboxylic acid group.

14. The polymerizable composition for a color filter according to claim 13, wherein the graft copolymer has a weight average molecular weight of 20,000 to 100,000.

* * * * *